(12) United States Patent
Lalovic et al.

(10) Patent No.: US 9,715,180 B2
(45) Date of Patent: Jul. 25, 2017

(54) WAFER-BASED LIGHT SOURCE PARAMETER CONTROL

(71) Applicant: Cymer, LLC, San Diego, CA (US)

(72) Inventors: Ivan Lalovic, San Francisco, CA (US); Omar Zurita, San Diego, CA (US); Gregory Allen Rechtsteiner, San Diego, CA (US); Paolo Alagna, Leuven (BE); Simon Hsieh, Taipei (TW); Jason J. Lee, Beaverton, OR (US); Rostislav Rokitski, La Jolla, CA (US); Rui Jiang, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 42 days.

(21) Appl. No.: 14/295,558

(22) Filed: Jun. 4, 2014

(65) Prior Publication Data

US 2015/0070673 A1    Mar. 12, 2015

Related U.S. Application Data

(60) Provisional application No. 61/833,892, filed on Jun. 11, 2013.

(51) Int. Cl.
*G03B 27/68* (2006.01)
*G03F 7/20* (2006.01)

(52) U.S. Cl.
CPC ...... *G03F 7/70358* (2013.01); *G03F 7/70041* (2013.01)

(58) Field of Classification Search
CPC .. G03F 7/70358; G03F 7/70041; G03B 27/02
See application file for complete search history.

(56) References Cited

U.S. PATENT DOCUMENTS

| | | | |
|---|---|---|---|
| 4,937,619 | A | 6/1990 | Fukuda et al. |
| 5,194,893 | A | 3/1993 | Nishi |
| 5,303,002 | A | 4/1994 | Yan |
| 5,742,376 | A | 4/1998 | Makinouchi |
| 5,963,324 | A * | 10/1999 | Murata ............... G03F 7/70691 356/401 |

(Continued)

OTHER PUBLICATIONS

Le-Gratiet et al., "Intrafield Process Control for 45 Nm CMOS Logic Patterning.", Metrology, Inspection, and Process Control for Microlithography XXIII, Proc. of SPIE, vol. 7272, Mar. 24, 2009, 10 pages.

(Continued)

*Primary Examiner* — Deoram Persaud
(74) *Attorney, Agent, or Firm* — DiBerardino McGovern IP Group LLC

(57) ABSTRACT

A photolithography method includes instructing an optical source to produce a pulsed light beam; scanning the pulsed light beam across a wafer of a lithography exposure apparatus to expose the wafer with the pulsed light beam; during scanning of the pulsed light beam across the wafer, receiving a characteristic of the pulsed light beam at the wafer; receiving a determined value of a physical property of a wafer for a particular pulsed light beam characteristic; and based on the pulsed light beam characteristic that is received during scanning and the received determined value of the physical property, modifying a performance parameter of the pulsed light beam during scanning across the wafer.

30 Claims, 18 Drawing Sheets

(56) References Cited

U.S. PATENT DOCUMENTS

| | | | |
|---|---|---|---|
| 6,218,077 B1 | 4/2001 | Jin | |
| 6,393,037 B1 | 5/2002 | Basting et al. | |
| 6,671,294 B2 | 12/2003 | Kroyan et al. | |
| 6,809,797 B2 | 10/2004 | Baselmans et al. | |
| 6,829,040 B1 | 12/2004 | Kye et al. | |
| 6,853,653 B2 | 2/2005 | Spangler et al. | |
| 6,862,079 B2 | 3/2005 | Sato | |
| 6,887,722 B2 | 5/2005 | Schedel et al. | |
| 6,952,267 B2 | 10/2005 | Rafac | |
| 7,053,979 B2 | 5/2006 | Smith et al. | |
| 7,088,758 B2 | 8/2006 | Sandstrom et al. | |
| 7,139,301 B2 | 11/2006 | Kroyan et al. | |
| 7,154,928 B2 | 12/2006 | Sandstrom et al. | |
| 7,277,466 B2 | 10/2007 | Partlo et al. | |
| 7,317,536 B2 | 1/2008 | Rafac | |
| 7,366,219 B2 | 4/2008 | Algots et al. | |
| 7,369,214 B2 * | 5/2008 | Galburt | G03F 9/7003 250/548 |
| 7,455,939 B2 | 11/2008 | Brunner et al. | |
| 7,477,356 B2 * | 1/2009 | Asaishi | G03F 7/70575 355/53 |
| 7,653,095 B2 | 1/2010 | Reiley et al. | |
| 7,701,555 B2 | 4/2010 | Arai | |
| 7,822,084 B2 | 10/2010 | O'Brien et al. | |
| 7,826,036 B2 * | 11/2010 | Sukegawa | G03F 7/70575 355/67 |
| 8,520,186 B2 | 8/2013 | Seong et al. | |
| 8,705,004 B2 | 4/2014 | Butler et al. | |
| 2002/0009175 A1 * | 1/2002 | Kurosawa | G03F 7/70358 378/34 |
| 2002/0193901 A1 | 12/2002 | Kikuchi | |
| 2003/0128344 A1 | 7/2003 | Nishi | |
| 2003/0133487 A1 | 7/2003 | Vogler | |
| 2004/0146082 A1 | 7/2004 | Kroyan et al. | |
| 2005/0041701 A1 | 2/2005 | Spangler et al. | |
| 2005/0068997 A1 | 3/2005 | Spangler et al. | |
| 2005/0190801 A1 * | 9/2005 | Sukegawa | H01S 3/106 372/20 |
| 2006/0114956 A1 | 6/2006 | Sandstrom et al. | |
| 2007/0195836 A1 | 8/2007 | Dunstan et al. | |
| 2007/0273852 A1 | 11/2007 | Arai | |
| 2007/0297467 A1 | 12/2007 | Fomenkov et al. | |
| 2008/0253408 A1 | 10/2008 | Ishihara | |
| 2008/0253413 A1 | 10/2008 | Partlo | |
| 2008/0259297 A1 | 10/2008 | Kawakubo | |
| 2009/0011346 A1 | 1/2009 | Ausschnitt et al. | |
| 2009/0170042 A1 | 7/2009 | Kanda et al. | |
| 2010/0103393 A1 * | 4/2010 | Motojima | G03F 9/7026 355/53 |
| 2010/0149647 A1 | 6/2010 | Figueroa et al. | |
| 2010/0165315 A1 | 7/2010 | Tanaka | |
| 2011/0096311 A1 * | 4/2011 | Butler | G03F 7/70358 355/53 |
| 2011/0102757 A1 * | 5/2011 | Butler | G03F 7/70525 355/67 |
| 2011/0205512 A1 | 8/2011 | Seong et al. | |
| 2012/0154773 A1 | 6/2012 | Beyer | |
| 2013/0039460 A1 | 2/2013 | Levy et al. | |
| 2014/0104614 A1 * | 4/2014 | Rokitski | G01J 3/1809 356/402 |
| 2015/0220006 A1 * | 8/2015 | Hsieh | G02B 7/28 355/67 |
| 2015/0261097 A1 * | 9/2015 | Mathijssen | 355/67 |

OTHER PUBLICATIONS

Le-Gratiet et al., "Integration and Automation of DoseMapper™ in a Logic Fab APC System. Application for 45/40/28nm node.", Metrology, Inspection, and Process Control for Microlithography XXVI, Proc. of SPIE, vol. 8324, Apr. 5, 2012, 10 pages.

Benschop et al., "Integrated Scatterometry for Tight Overlay and CD Control to Enable 20-nm Node Wafer Manufacturing", Optical Microlithography XXVI, Proc. of SPIE, vol. 8683, Apr. 12, 2013, 8 pages.

Driessen et al., "Holistic Lithography for EUV: NXE:3100 Characterization of First Printed Wafers Using an Advanced Scanner Model and Scatterometry", Photomask Technology, Proc. of SPIE, vol. 8166, Oct. 14, 2011, 11 pages.

Mulkens et al., "Holistic Optimization Architecture Enabling Sub-14-nm Projection Lithography", Journal of Micro/Nanolithography, MEMS, and MOEMS, vol. 13, No. 1, Jan.-Mar. 2014, 11 pages.

Smilde et al., "Optical Scatterometry for In-Die Sub-Nanometer Overlay Metrology", International Conference on Frontiers of Characterization and Metrology for Nanoelectronics, Mar. 25-28, 2013, NIST, 1 page.

Brunner et al., "Laser Bandwidth and Other Sources of Focus Blur in Lithography," Optical Microlithography XIX, Proc. of SPIE, vol. 6154, 2006, pp. 323-330.

Dunstan et al., "Active Spectral Control of DUV Light Sources for OPE Minimization", Optical Microlithography XIX, Proc. of SPIE, vol. 6154, Mar. 15, 2006, 9 pages.

Jacques et al., "Active Spectral-Control Techniques for Improving OPC", Solid State Technology, Dec. 2006, vol. 49, No. 12, 5 pages.

Fukuda et al., "A New Method for Enhancing Focus Latitude in Optical Lithography: FLEX", Electron Device Letters, IEEE, vol. 8, No. 4, Apr. 1987, pp. 179-180.

Fukuda et al., "Improvement of Defocus Tolerance in a Half-Micron Optical Lithography by the Focus Latitude Enhancement Exposure Method: Simulation and Experiment", J. Vac. Sci. Technol. B, vol. 7, No. 4, 1989, pp. 667-674.

Lalovic et al., "RELAX: Resolution Enhancement by Laser-spectrum Adjusted Exposure", Optical Microlithography XVIII, Proc. of SPIE, vol. 5754, 2005, pp. 447-455.

Lalovic et al., "Illumination Spectral Width Impacts on Mask Error Enhancement Factor and Iso-dense Bias in 0.6-NA KrF Imaging", 21st Annual BACUS Symposium on Photomask Technology, Proc. of SPIE, vol. 4562, Mar. 11, 2002, 8 pages.

Terry et al., "Behavior of Lens Aberrations as a Function of Wavelength on Krf and Arf Lithography Scanners", Optical Microlithography XIV, Proc. of SPIE, vol. 4346, 2001, pp. 15-24.

Lai et al., "Understanding Chromatic Aberration Impacts on Lithographic Imaging", Journal of Microlithography, Microfabrication, and Microsystems (JM3), vol. 2, No. 2, 2003, pp. 105-111.

Van Look et al., "Effect of Laser Bandwidth Tuning on Line/Space and Contact Printing at 1.35 NA", Proceedings of the 5th International Symposium on Immersion Lithography Extensions, The Hague, Netherlands, Sep. 22-25, 2008, 1 page.

Kroyan et al., "Effects of 95% Integral vs. FWHM Bandwidth Specifications on Lithographic Imaging", Optical Microlithoraphy XIV, Proc. SPIE, vol. 4346, 2001, pp. 1244-1253.

Lalovic et al., "Defining a Physically-Accurate Laser Bandwidth Input for Optical Proximity Correction (OPC) and Modeling", BACUS XXII Photomask Technology Symposium, Proc. of SPIE, vol. 7122, Oct. 2008, 12 pages.

De Bisschop et al., "Impact of Finite Laser Bandwidth on the Critical Dimension of L/S Structures", Journal of Micro / Nanolithography, MEMS and MOEMS (JM3), vol. 7, No. 3, Jul.-Sep. 2008, pp. 1-16.

Smith et al., "Modeling and Performance Metrics for Longitudinal Chromatic Aberrations, Focus Drilling, and Z-noise; Exploring Excimer Laser Pulse Spectra", Optical Microlithography XX, Proc. of SPIE, vol. 6520, Mar. 2007, 8 pages.

Iessi et al., "Laser Bandwidth Effect on Overlay Budget and Imaging for the 45 nm and 32 nm Technology Nodes with Immersion Lithography", Optical Microlithography XXIII, Proc. of SPIE, vol. 7640, Mar. 2010, 12 pages.

Huggins et al., "Effects of Laser Bandwidth on OPE in a Modern Lithography Tool", Optical Microlithography XIX, Proc. of SPIE, vol. 6154, 2006, 12 pages.

Robert J. Rafac, "Overcoming Limitations of Etalon Spectrometers Used for Spectral Metrology of DUV Excimer Light Sources", Optical Microlithography XVII, Proc. of SPIE, vol. 5377, 2004, pp. 846-858.

(56) References Cited

OTHER PUBLICATIONS

Lalovic et al., "Depth of Focus Enhancement by Wavelength Modulation: Can we RELAX and Improve Focus Latitude?", presented at Arch Chemical INTERFACE Symposium, San Diego, CA, Sep. 21-23, 2003 10 pages.
Kroyan et al., "Contribution of Polychromatic Illumination to Optical Proximity Effects in the Context of Deep-UV Lithography", BACUS XXI Photomask Technology Symposium, Proc. of SPIE, vol. 4562, 2002, 9 pages.
Lai et al., "Chromatic Aberration Impacts on 0.68NA KrF Lithographic Imaging," Interface Microlithography Symposium Proceedings, 2001, 9 pages.
Lalovic et al., "Investigation of Cross-Field Wavefront Aberrations of Krf Lithography Exposure Systems as a Function of Excimer Laser Bandwidth", Optical Microlithography XIV, Proc. of SPIE, vol. 4346, 2001, pp. 1262-1271.
Kroyan et al., "Modeling the Effects of Eximer Laser Bandwidths on Lithographic Performance", Optical Microlithography XIII, Proc. SPIE, vol. 4000, 2000, pp. 658-664.
Yan et al., "Effects of Chromatic Aberration in Excimer Laser Lithography", Optical/Laser Microlithography V, Proc. SPIE, vol. 1674, Jun. 1992, pp. 316-327.
International Search Report, mailed Oct. 1, 2014, counterpart International Application No. PCT/U14/41176, International Filing Date Jun. 5, 2014, 2 pages.
Written Opinion, mailed Oct. 1, 2014, counterpart International Application No. PCT/U14/41176, International Filing Date Jun. 5, 2014, 6 pages.
Office Action, counterpart Chinese Patent Application No. 201480041169.X, mailed Dec. 1, 2016, 18 pages total (including English translation of 11 pages).
Office Action Search Report, counterpart Chinese Patent Application No. 201480041169.X, mailed Nov. 22, 2016, 3 pages total.

\* cited by examiner

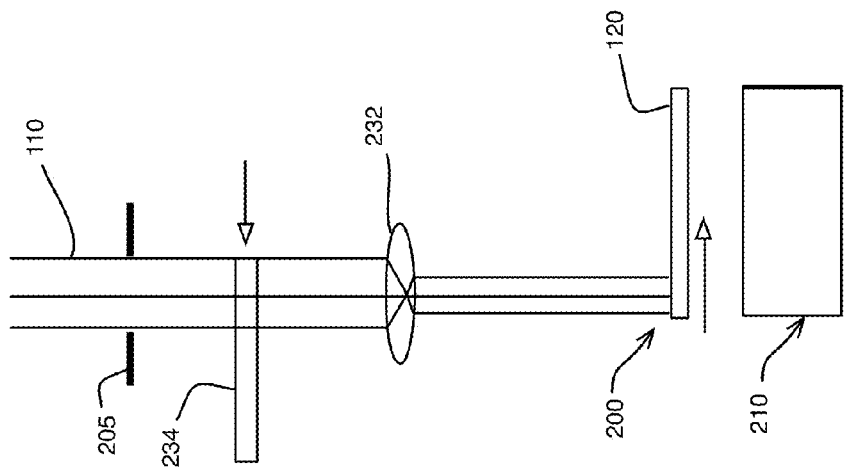
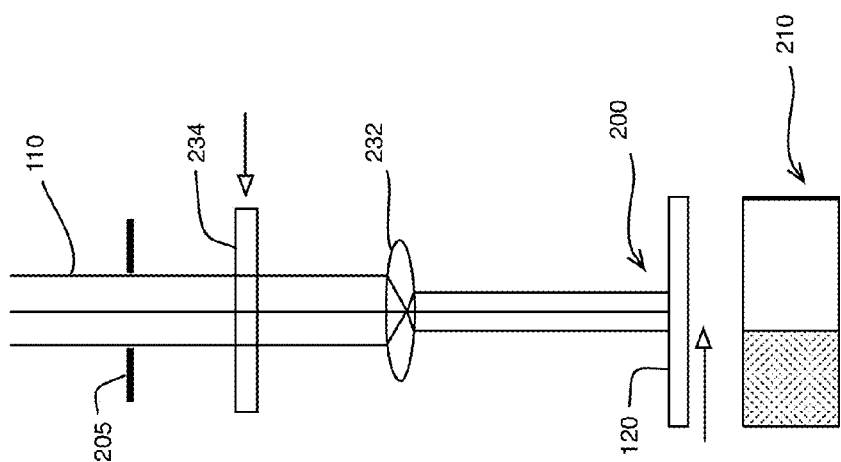

'Cushion recipe'

TEST RANGE:
Nominal – > Max    1.5pm E95

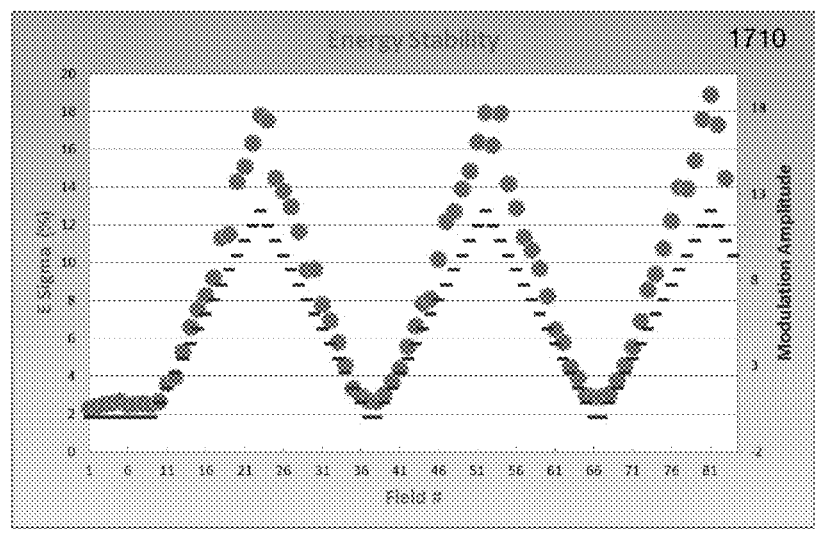
Fig. 17A
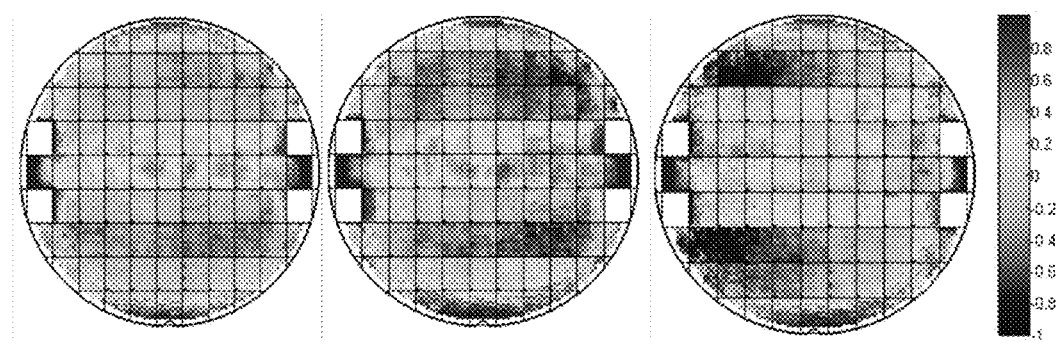
600fm
Fig. 17B
800fm
Fig. 17C
900fm
Fig. 17D

2200

2200

2230

WAFER-BASED LIGHT SOURCE PARAMETER CONTROL

TECHNICAL FIELD

The disclosed subject matter relates to wafer-based light source parameter control.

BACKGROUND

Photolithography is the process by which semiconductor circuitry is patterned on a substrate such as a silicon wafer. A photolithography light source provides the deep ultraviolet (DUV) light used to expose a photoresist on the wafer. DUV light for photolithography is generated by excimer light sources. Often, the light source is a laser source and the pulsed light beam is a pulsed laser beam. The light beam is passed through a beam delivery unit, filtered through a reticle (or mask), and then projected onto a prepared silicon wafer. In this way, a chip design is patterned onto a photoresist that is then etched and cleaned, and then the process repeats.

SUMMARY

In some general aspects, a photolithography method includes instructing an optical source to produce a pulsed light beam; scanning the pulsed light beam across a wafer of a lithography exposure apparatus to expose the wafer with the pulsed light beam; during scanning of the pulsed light beam across the wafer, receiving a characteristic of the pulsed light beam at the wafer; receiving a determined value of a physical property of a wafer for a particular pulsed light beam characteristic; and based on the pulsed light beam characteristic that is received during scanning and the received determined value of the physical property, modifying a performance parameter of the pulsed light beam during scanning across the wafer.

Implementations can include one or more of the following features. For example, the determined value of the physical property can include an error in the physical property of the wafer. The physical property can be one or more of a contrast of a feature formed on the wafer, a critical dimension at a wafer area exposed to the pulsed light beam, a photoresist profile at a wafer area exposed to the pulsed light beam, an overlay between layers formed on the wafer, and a side-wall angle at a wafer area exposed to the pulsed light beam.

The determined value of the physical property of the wafer for a particular light beam characteristic can be received by receiving a set of determined values of the physical property for a wafer that has been previously exposed by the light beam of the optical source for a set of light beam characteristics on the previously-exposed wafer.

The characteristic of the light beam at the wafer can be received during scanning of the pulsed light beam across the wafer by receiving a location at which the light beam exposes the wafer.

The characteristic of the light beam at the wafer can be received during scanning of the pulsed light beam across the wafer by receiving an energy of the light beam as it exposes the wafer.

The performance parameter of the pulsed light beam can be modified by modifying a target performance parameter of the pulsed light beam. The method can further include receiving a measurement of the performance parameter of the pulsed light beam; determining whether the measured performance parameter matches the modified target performance parameter; and if it is determined that the measured performance parameter does not match the modified target performance parameter, sending a signal to the optical source to modify the performance parameter of the pulsed light beam.

The light beam characteristic at the wafer can be received by receiving a control signal from the lithography exposure apparatus to the optical source; and determining the light beam characteristic at the wafer based on the received control signal.

The method can include determining a modification to the performance parameter of the pulsed light beam. The modification to the performance parameter of the pulsed light beam can be determined by accessing a stored set of performance parameters as a function of light beam characteristics at the wafer; selecting the value for the performance parameter within the accessed set that corresponds to the received characteristic of the light beam at the current wafer; and comparing the selected value of the performance parameter with a current value of the performance parameter of the pulsed light beam. The method can include, if the selected value of the performance parameter does not match the current value, then determining that the current performance parameter needs to be adjusted to match the selected value.

The determined value of the physical property of the wafer for the particular light beam characteristic can be received by selecting the value of the physical property of the wafer for the particular light beam characteristic based on the received characteristic of the light beam.

The determined value of the physical property of the wafer can be received by receiving a set of measured physical properties of the wafer at a set of light beam characteristics at the wafer. The method can also include, for each light beam characteristics at the wafer in the set, determining a performance parameter of the pulsed light beam based on the measured physical property; and storing the determined performance parameter at each light beam characteristic within the set.

The pulsed light beam can be scanned across the wafer by scanning the pulsed light beam across a field of the wafer, the field being a fraction of the total area of the wafer exposed; and the characteristic of the light beam can be received by receiving the characteristic during the scanning across the field.

The performance parameter of the pulsed light beam can be modified by modifying one or more of a spectral feature, an error of a spectral feature, an energy of the pulsed light beam, a dose of the pulsed light beam, an error in a wavelength of the pulsed light beam, a bandwidth of the pulsed light beam, and a spectral shape of the pulsed light beam.

The method can include correcting errors in patterning at the wafer based on modifying the performance parameter of the pulsed light beam. The errors in the wafer patterning can be corrected without modifying the lithography exposure apparatus. The errors in the wafer patterning can be corrected without modifying optical features or components within the lithography exposure apparatus.

The performance parameter of the pulsed light beam can be modified by modifying a spectral feature of the pulsed light beam, and the method can include generating an estimate of a spectral feature each time the light beam characteristic is received.

The light beam characteristic can be received at each field of the wafer, the field being a fraction of the total area of the wafer exposed and that area of the wafer that is exposed in one scan of an exposure window.

The pulsed light beam can be produced by perturbing a spectral shape of the pulsed light beam on a pulse-to-pulse basis. The spectral shape of the pulsed light beam can be perturbed on a pulse-to-pulse basis by shifting a central wavelength of each pulse of the light beam from a baseline wavelength in a predefined repeating pattern. The performance parameter of the pulsed light beam can be modified by modifying how much the central wavelength of each pulse of the light beam is shifted from the baseline wavelength.

The method can also include, before scanning the wafer: measuring the physical property within a scan at each exposure field of one or more previously exposed wafers; and creating a table that correlates each measured physical property for each exposure field across an entire wafer that is exposed with the pulsed light beam. The determined value of the physical property can be received by receiving the measured physical property for the current exposure field from the created table. The light beam characteristic can be received by receiving a detection of a start of an exposure of the wafer; and receiving a detection of an end of the exposure of the wafer.

In other general aspects, a photolithography system includes an optical source that produces a pulsed light beam; a set of optical components that direct the pulsed light beam to a wafer of a photolithography exposure apparatus to thereby expose the wafer with the pulsed light beam; a scanning optical system within the lithography exposure apparatus configured to scan the pulsed light beam across the wafer; a monitoring module within the lithography exposure apparatus that outputs a characteristic of the pulsed light beam at the wafer during scanning of the wafer; a correlation module that receives a set of measured values of a physical property for a wafer for a set of pulsed light beam characteristics at the wafer and outputs a correlation between a target performance parameter of the pulsed light beam and the pulsed light beam characteristic at the wafer based on the received determined values; a performance parameter module connected to the monitoring module to receive the output of the pulsed light beam characteristic at the wafer and to the correlation module to receive the correlation recipe and configured to output a value for the performance parameter based on the received light beam characteristic and the correlation recipe; and an optical source module connected to the performance parameter module to receive the outputted value for the performance parameter and connected to an optical source actuation system that actuates one or more physical features of the optical source to modify one or more performance parameters of the optical source based on the received outputted value.

Implementations can include one or more of the following features. For example, the photolithography system can also include a metrology module that includes a wafer holder that receives one or more wafers; and a detection system that measures the physical property of the wafer for each light beam characteristic at the wafer and outputs the measured physical property for each light beam characteristic at the wafer. The correlation module can be connected to receive the output from the metrology module and to create the correlation recipe based on the output from the metrology module. The light beam characteristic at the wafer can include a location of the pulsed light beam as it exposes the wafer.

DESCRIPTION OF DRAWINGS

FIGS. 2B and 2C are block diagrams of the exemplary lithography exposure apparatus of FIG. 2A showing exemplary steps during exposure;

FIG. 17A is a graph showing how the light beam performance parameter (energy) is controlled using the procedure of FIG. 12;

FIGS. 17B-17D are charts showing how a measured physical property on the wafer varies as the bandwidth is modified at each field for distinct respective ranges of bandwidth;

DESCRIPTION

Figure 1:
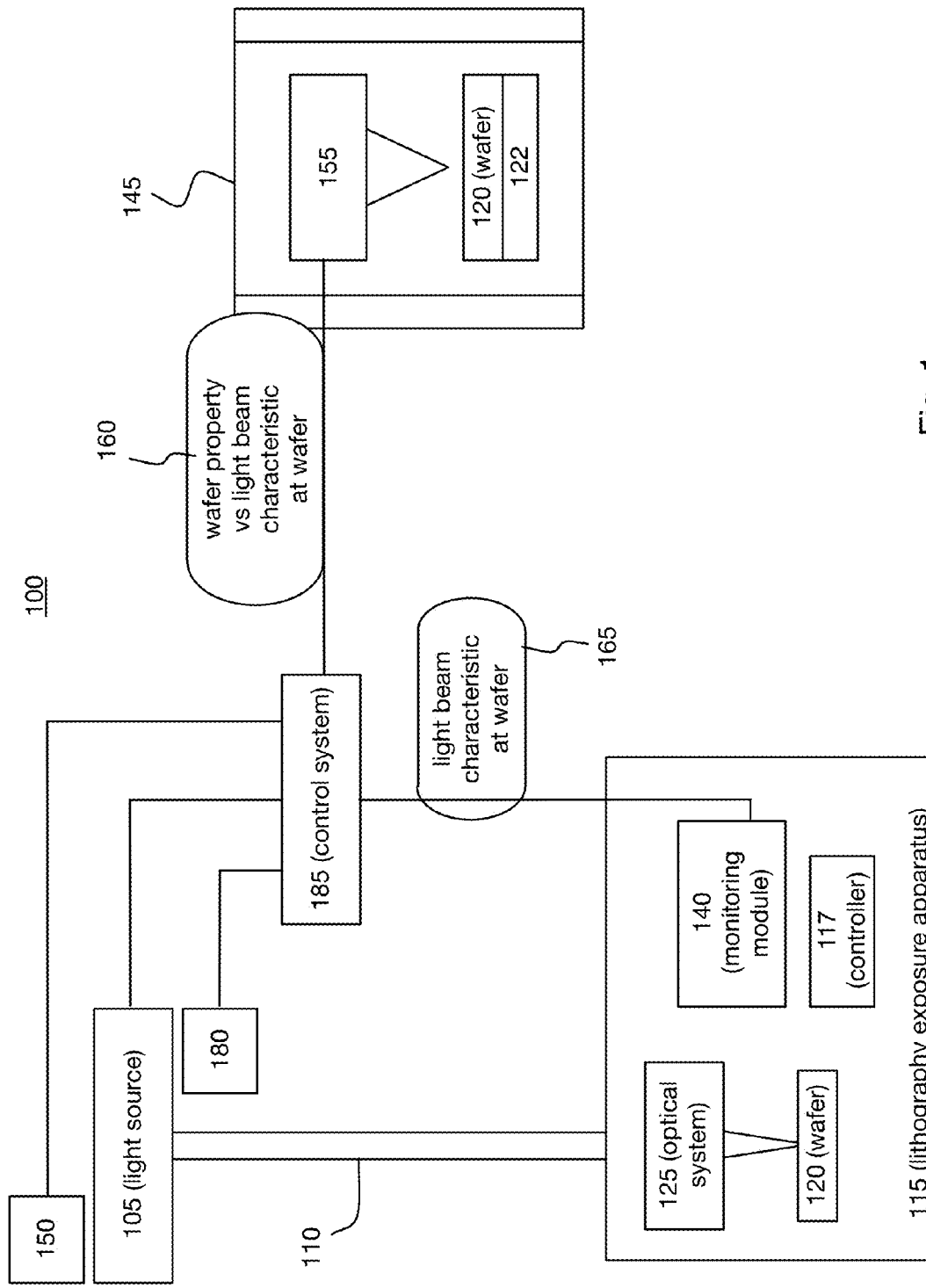
FIG. 1 is a block diagram of a photolithography system including a lithography exposure apparatus and a metrology apparatus.

Referring to FIG. 1, a photolithography system 100 includes an optical (or light) source 105 that directs a pulsed light beam 110 to a wafer 120. The photolithography system 100 also includes a lithography exposure apparatus 115 that receives the wafer 120, and a control system 185 connected to the lithography exposure apparatus 115 and to the light source 105. The lithography exposure apparatus 115 includes a scanning optical system 125, a monitoring module 140, and an internal controller 117. The monitoring module 140 detects or measures a characteristic (for example, a location) of the pulsed light beam 110 at the wafer 120 while the wafer 120 is being exposed to the pulsed light beam 110.

The photolithography system 100 includes a metrology apparatus 145 that includes a wafer holder 122 that receives a wafer 120 and a detection system 155. In some implementations, the wafer holder 122 receives one or more previously exposed wafers 120. In other implementations, the wafer holder 122 also holds the wafer 120 while the light beam scans the wafer 120, and, thus, in these implementations, the metrology apparatus 145 enables real-time (that is, during the exposure of the wafer) metrology.

The detection system 155 measures a physical property of the wafer 120 that corresponds to a particular light beam characteristic at the wafer. For example, the physical property of the wafer 120 can be a contrast of a physical feature formed on the wafer during lithography, a critical dimension at a wafer area exposed to the light beam 110 during lithography, a photoresist profile at a wafer area exposed to the light beam 110 during lithography, an overlay of each layer formed on the wafer during lithography, or a side-wall angle of a feature at a wafer area exposed to the light beam 110 during lithography. For example, the light beam characteristic can be specific locations at which the light beam exposes the wafer 120 during lithography. In this example, the detection system 155 measures the physical property for each wafer location at which the light beam exposes the wafer. The detection system 155 outputs a set of data 160 that includes one or more measured physical properties for each light beam characteristic at the wafer. The number of light beam characteristics at the wafer that are measured by the detection system 155 can be selected based on the amount of control desired or can be based on the specific physical property that is measured.

The control system 185 receives the output 160 of the measured physical property for each light beam characteristic at the wafer from the detection system 155 of the metrology apparatus 145. Based on this received information, the control system 185 can determine whether there are errors in the physical shape of a previously-processed (using the photolithography system 100) wafer 120 for each light beam characteristic on the wafer 120 and can determine how to adjust a performance parameter of the pulsed light beam 110 to compensate for these errors in the wafer shape. Or, the control system 185 can determine how to adjust the performance parameter of the light beam 110 to adjust the wafer shape. The wafer shape is the geometric pattern formed on the wafer 120 due to the patterning that happens while the wafer 120 is exposed to the light beam 110. Thus, the geometric pattern can be a series of engravings in the wafer or a series of depositions of new material in a desired pattern, and this geometric pattern is uniquely shaped to enable the use of the wafer and chips formed from the wafer.

Other components of the photolithography system 100, such as a performance parameter system 150 and one or more measurement systems 180, are connected to the control system 185. For example, the performance parameter system 150 can include a spectral feature module that receives a light beam from the light source 105 and that finely tunes the spectral output of the light source 105 based on the input from the control system 185. The one or more measurement systems 180 measure properties such as, for example, spectral features (such as bandwidth and wavelength), or energy, of the light beam 110 that is output from the light source 105.

During scanning of the current wafer 120 in the lithography exposure apparatus 115, the control system 185 receives information 165 representative of how the light beam 110 scans the wafer 120 from the monitoring module 140. This information is a characteristic (such as a spatial location or energy) of the light beam 110 as it exposes the wafer 120. For example, the information can be used to determine the location at which the light beam 110 is exposing the wafer 120.

The control system 185 uses both the information 165 from the monitoring module 140 and the output 160 from the detection system 155 to determine how to modify one or more optical performance parameters of the pulsed light beam 110 produced by the light source 105. In this way, the variation or perturbation of the one or more optical performance parameters of the pulsed light beam 110 can be used to thereby modify a physical property or an error in the physical property of the wafer 120 that persistently occurs during scanning of the wafer within the lithography exposure apparatus 115.

Because of this, the light source 105 can be driven on an intra-wafer (for example, field-to-field) or intra-field (for example, slit-to-slit) basis while it is exposing the wafer 120 and without making changes to the lithography exposure apparatus 115. The disclosed technique can enable real-time arbitrary spectrum generation on a wafer-to-wafer, field-to-field, or slit-to-slit basis. This can enhance the capability and flexibility of wafer exposure and data logging.

Figure 2A:
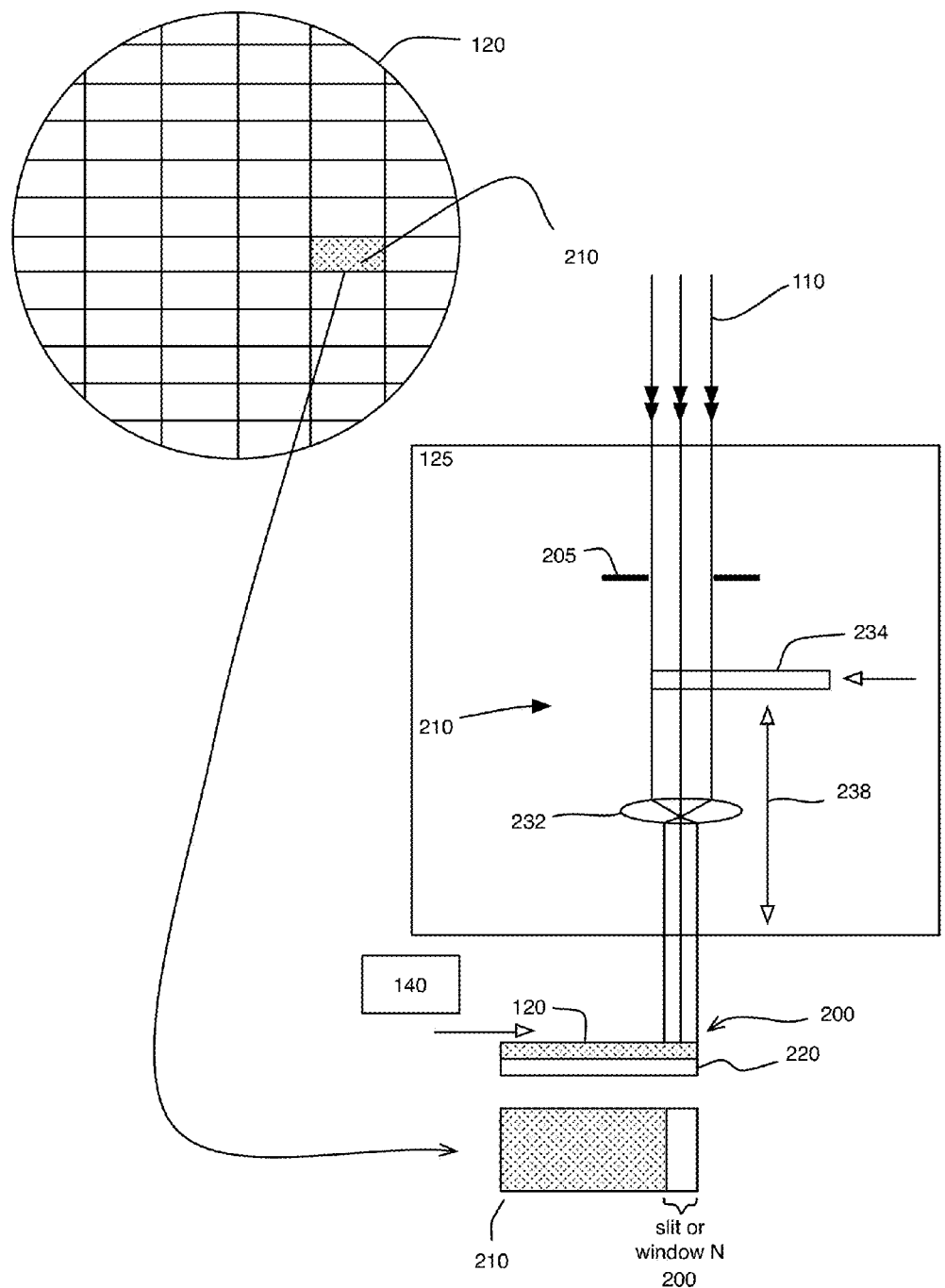
FIG. 2A is a block diagram of an exemplary lithography exposure apparatus of the system of FIG. 1.

Referring also to FIG. 2A, a discussion of the exposure of the wafer 120 is provided. The controller 117 controls how layers are printed on the wafer 120 by providing commands to the light source 105 (for example, through the control system 185) to supply a light beam 110 with specific characteristics and timing.

The lithography exposure apparatus 115 includes a stage 220 on which the wafer 120 is carried to enable the wafer 120 to be moved during exposure from the light beam 110. The lithography exposure apparatus 115 includes an optical arrangement 210 that includes an illuminator system having, for example, one or more condenser lenses, a mask 234, and an objective arrangement 232. The mask 234 is movable along one or more directions, such as along an optical axis 238 of the light beam 110 or in a plane that is perpendicular to the optical axis 238. The objective arrangement 232 includes a projection lens and enables the image transfer to occur from the mask 234 to the photoresist on the wafer 120. The illuminator system also adjusts the range of angles for the light beam 110 impinging on the mask 234.

The "field" refers to an exposure field 210 of the wafer 120, and the exposure field 210 is the area of the wafer 120 that is exposed in one scan of an exposure slit or window 200, and the exposure window 200 is the illuminated area of the wafer 120 that is exposed in one illumination dose. The number of pulses of the light beam 110 that illuminate the same area (exposure window) is controlled by exposure one or more exposure slits within the lithography exposure apparatus 115.

During exposure, the wafer 120 is irradiated by the light beam 110. A process program or recipe determines the length of the exposure on the wafer 120, the mask 234 that is used, as well as other factors that affect the exposure.

The controller 117 controls how layers are printed on the wafer 120 by providing commands to the light source 105 (for example, through the control system 185) to supply a light beam 110 with specific characteristics and timing. In particular, the controller 117 controls when the light source 105 emits a pulse or a burst of pulses by sending one or more signals to the light source 105.

Thus, in the example in which the light beam characteristic at the wafer 120 is the location at which the light beam exposes the wafer 120, then the detection system 155 can measure the physical property of the wafer for each field, for each slit, or for a certain number of pulses of the light beam; so that the number of wafer locations can be as low as 1-10 locations per wafer field or 1-10 locations per wafer, and as high as 100-300 locations per wafer field (or can be on a per-slit basis or a per-pulse basis).

Figure 3:
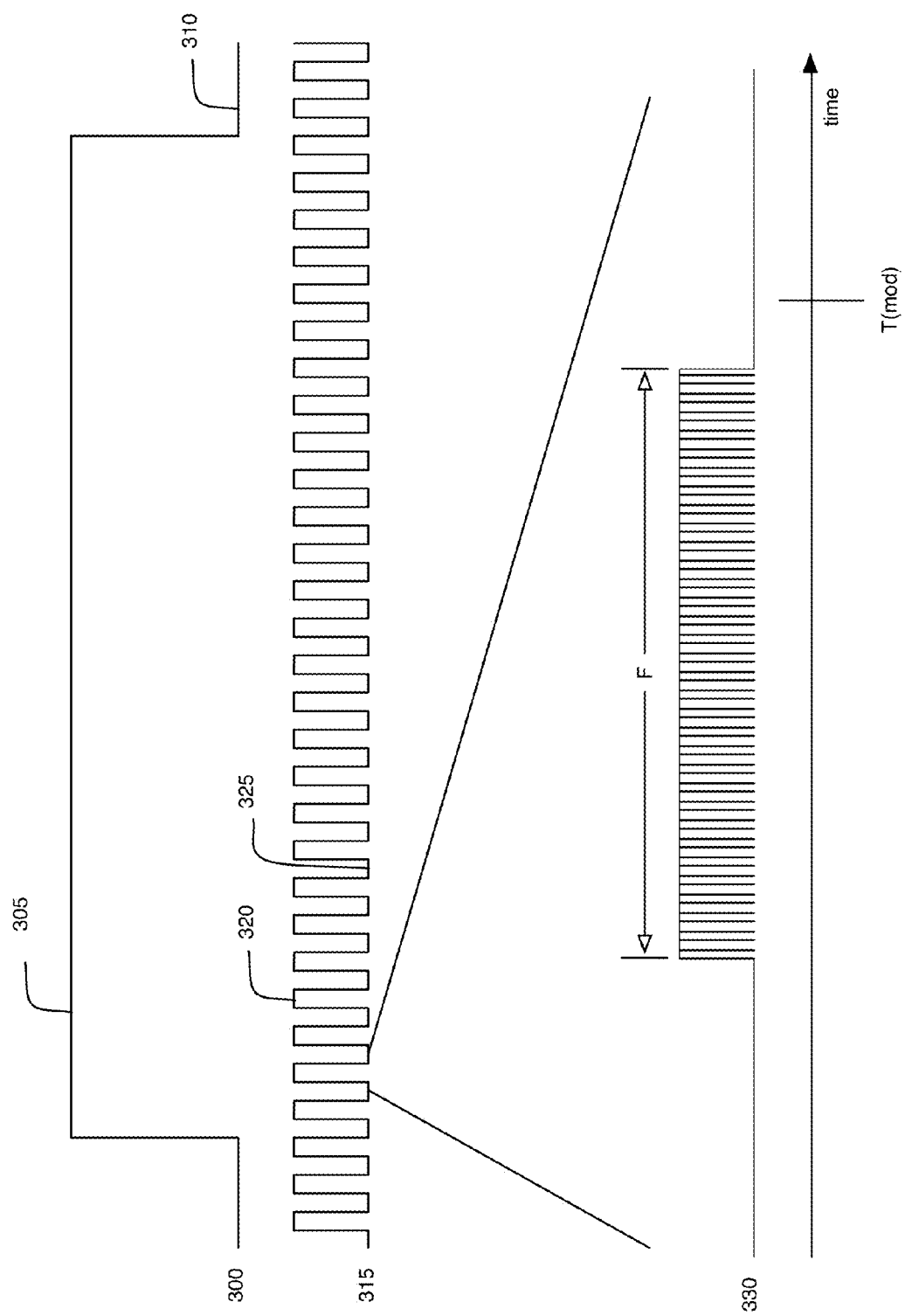
FIG. 3 is a graph of exemplary signals versus time that are produced by an internal controller of the lithography exposure apparatus of FIG. 1.

For example, and with reference to FIG. 3, the controller 117 can be configured to send a wafer exposure signal 300 to the light source 105 that tells the light source 105 to start a wafer exposure when it determines that a new wafer 120 has been placed on the stage 220. The wafer exposure signal 300 can have a high value 305 (for example, an integer such as 5) while the wafer is being exposed and can switch to a low value 310 (for example, 0) at the end of the wafer exposure. Additionally, the controller 117 sends a gate signal 315 to the light source 105; the gate signal 315 has a high value 320 (for example, 1) during an entire burst of pulses and a low value 325 (for example, 0) during the time between bursts. The number of pulses in a burst can be the same number of pulses of the light beam 110 that illuminate the same exposure window and thus can be the same as the field. In some implementations, the value of a burst (or field) is in the hundreds, for example 100-400 pulses. The controller 117 also sends a trigger signal 330 to the light source 105; the trigger signal 330 has a high value (for example, 1) for each pulse of the light source 105 and a low value (for example, 0) for the time between each successive pulses.

During lithography, the plurality of pulses of the light beam 110 illuminate the same area of the wafer 120 to form the illumination dose. The size of the slit 200 is controlled by an exposure slit 205 placed before the mask 234. The slit 205 can be designed like a shutter and can include a plurality of blades that can be opened and closed; and the size of the exposed area is then determined by the distance between the blades in the scanning and non-scanning direction. In some implementations, the value of N is in the tens, for example, from 10-100 pulses, from 10-70 pulses, or from 10-50 pulses. In other implementations, the value of N is in the hundreds, for example, 100-400 pulses.

One or more of the mask 234, the objective arrangement 232, and the wafer 120 can be moved relative to each other during the exposure to scan the exposure window 200 across the exposure field 210. For example, FIGS. 2B and 2C show two exemplary steps in the scanning.

Optical performance parameters of the pulsed light beam 110 include the energy of the light beam 110, spectral properties of the light beam 110, such as the wavelength or bandwidth, and errors in the energy or spectral properties of the light beam 110. A discussion of the spectral properties of the light beam 110 and the light source 105 follows.

Figure 4:
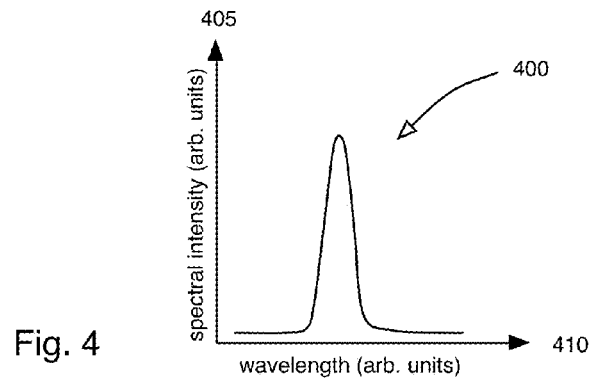
FIG. 4 is a graph of an exemplary optical spectrum produced by a light source of the photolithography system of FIG. 1.

Referring to FIG. 4, the optical spectrum (or emission spectrum) 400 of the pulsed light beam 110 produced by the light source 105 contains information on how the optical energy or power is distributed over different wavelengths. The optical spectrum 400 of the light beam 110 is depicted in the form of a diagram where the spectral intensity 405 (not necessarily with an absolute calibration) is plotted as a function of the wavelength or optical frequency 410. The optical spectrum 400 can be referred to as the spectral shape or intensity spectrum of the light beam 110. Spectral properties or features of the light beam 110 include any aspect or representation of the intensity spectrum. For example, bandwidth is a spectral feature. The bandwidth of the light beam is a measure of the width of this spectral shape, and this width can be given in terms of wavelength or frequency of the laser light. Any suitable mathematical construction (that is, metric) related to the details of the optical spectrum 400 can be used to estimate a value that characterizes the bandwidth of the light beam. For example, the full width of the spectrum at a fraction (X) of the maximum peak intensity of the spectral shape (referred to as FWXM) can be used to characterize the light beam bandwidth. As another example, the width of the spectrum that contains a fraction (Y) of the integrated spectral intensity (referred to as EY) can be used to characterize the light beam bandwidth.

Figure 5:
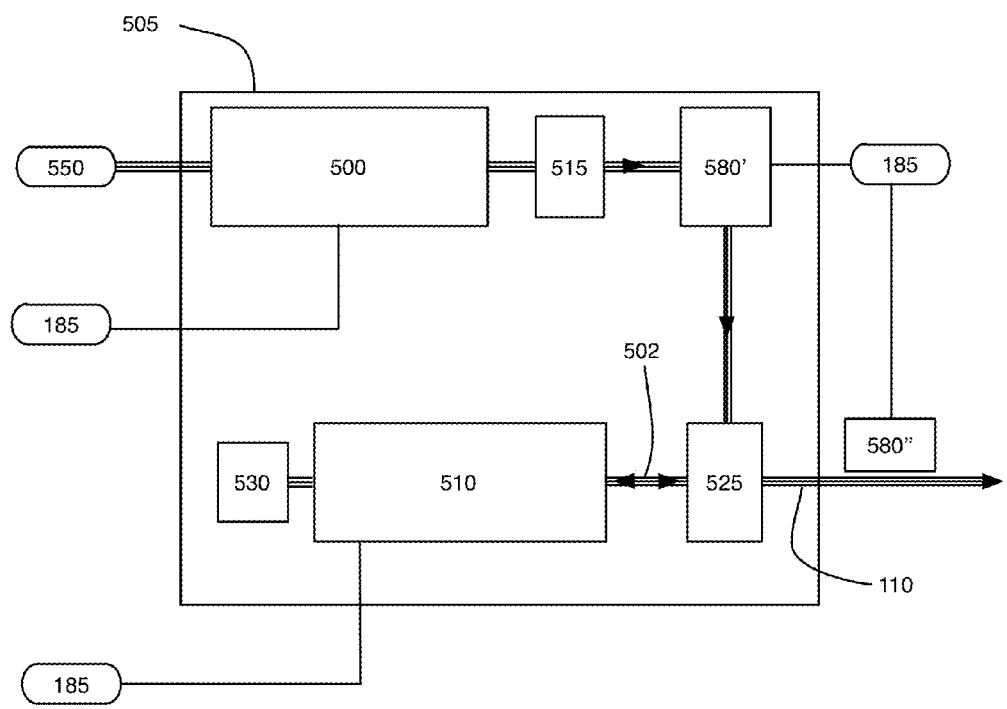
FIG. 5 is a block diagram of an exemplary light source of the photolithography system of FIG. 1.

Referring to FIG. 5, an exemplary light source 505 is a pulsed laser source that produces as the light beam 110 a pulsed laser beam. As shown in the example of FIG. 5, the light source 505 is a two-stage laser system that includes a master oscillator (MO) 500 that provides a seed light beam 502 to a power amplifier (PA) 510. The master oscillator 500 typically includes a gain medium in which amplification occurs and an optical feedback mechanism such as an optical resonator. The power amplifier 510 typically includes a gain medium in which amplification occurs when seeded with the seed laser beam from the master oscillator 500. If the power amplifier 510 is designed as a regenerative ring resonator then it is described as a power ring amplifier (PRA) and in this case, enough optical feedback can be provided from the ring design. The master oscillator 500 enables fine tuning of spectral parameters such as the center wavelength and the bandwidth at relatively low output pulse energies. The power amplifier 510 receives the output from the master oscillator 500 and amplifies this output to attain the necessary powers for output to use in photolithography.

In this example, the performance parameter system 150 includes a spectral feature selection module 551 and the one or more measurement systems 180 include measurement systems 580' and 580", which are connected to the control system 185. The measurement system 580' is a line center analysis module (LAM) that receives an output from the output coupler 515.

The master oscillator 500 includes a discharge chamber having two elongated electrodes, a laser gas that serves as the gain medium, a fan for circulating the gas between the electrodes, and a laser resonator is formed between the spectral feature selection system 550 on one side of the discharge chamber and an output coupler 515 on a second side of the discharge chamber. One or more beam modification optical systems 525 modify the size and/or shape of the laser beam as needed. The line center analysis module 580' is an example of a type of measurement system 180 that can be used to measure or monitor the wavelength of the seed light beam 502. The line center analysis module can be placed at other locations within the light source 505, or it can be placed at the output of the light source 505.

The laser gas used in the discharge chamber can be any suitable gas for producing a laser beam around the required wavelengths and bandwidth, for example, the laser gas can be argon fluoride (ArF), which emits light at a wavelength of about 193 nm, or krypton fluoride (KrF), which emits light at a wavelength of about 248 nm.

The power amplifier 510 includes a power amplifier discharge chamber, and if it is a regenerative (recirculating) ring amplifier, the power amplifier also includes a beam reflector 530 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 502 is amplified by repeatedly passing through the power amplifier 510. The beam modification optical system 525 provides a way (for example, a partially-reflecting mirror) to in-couple the seed light beam and to out-couple a portion of the amplified radiation from the power amplifier to form the output light beam 110.

The measurement system 580" is used to produce a baseline optical spectrum of the light beam 110. In some implementations, the measurement system 580" can include a grating spectrometer such as the ELIAS echelle spectrometer produced by LTB Lasertechnik Berlin GmbH, of Berlin, Germany. In other implementations, the measurement system 580" can be used for onboard, real-time measurement of spectral properties and include an etalon spectrometer that receives a portion of the light beam 110 that is redirected from a beam splitting device placed along the path of the light beam 110. The etalon spectrometer includes an optical arrangement including an etalon through which the light beam portion travels, and a detector that receives the output light from the optical arrangement. The output of the detector is connected to the control system 185; in this way, the control system 185 receives each optical spectrum 400 recorded by the detector.

Referring again to FIG. 2A, the microelectronic features can be formed on the wafer 120 by, for example, depositing a layer of radiation-sensitive photoresist material on the wafer, then positioning the patterned mask 234 over the photoresist layer, and then exposing the masked photoresist layer to the selected radiation (that is, the light beam 110). The wafer 120 is then exposed to a developer, such as an aqueous base or a solvent. And, the portions of the photoresist layer that are resistant to the developer remain on the wafer 120, and the rest of the photoresist layer is removed by the developer to expose the material of the wafer 120 below.

The wafer 120 can be processed using additional process steps, which can be one or more of a combination of process steps such as etching, deposition, and lithography processes with a different mask 234 to create a pattern of openings (such as grooves, channels, or holes) in the material of the wafer 120 or in materials deposited on the wafer 120. These openings can be filled with insulative, conductive, or semiconductive materials to build layers of the microelectronic features on the wafer 120. The wafer 120 is then singulated to form individual chips, which can be incorporated into a wide variety of electronic products, such as computers and other consumer or industrial electronic devices.

As the size of the microelectronic features formed in the wafer 120 decreases (for example, to reduce the size of the chip that is formed by the wafer 120), the size of the features formed in the photoresist layer must also decrease. The critical dimension (CD) is the feature size that needs to be printed on the semiconductor substrate (the wafer 120) and therefore the CD can require tight size control.

One way to decrease the CD is to increase the numerical aperture (NA) of the projection lens in the objective arrangement 232. However, as the NA of the projection lens increases, the projected image of the mask 234 on the wafer 120 loses depth of focus (DOF) at isolated features. DOF is needed to achieve a higher yield of processed wafers since the manufacturing process requires a variation in focus. As a result of the lower DOF, the yield of processed wafers can be unacceptably low.

Most projection lenses (used in the objective arrangement 232) have chromatic aberration, which produces an imaging error on the wafer 120 if there is a wavelength error of the light source 105. One error caused by chromatic aberration is focus error and other errors tend to be much smaller. For example, if the wavelength of the light beam 110 is off of the target wavelength, the image on the wafer 120 will have a significant focal plane error.

Figure 6:
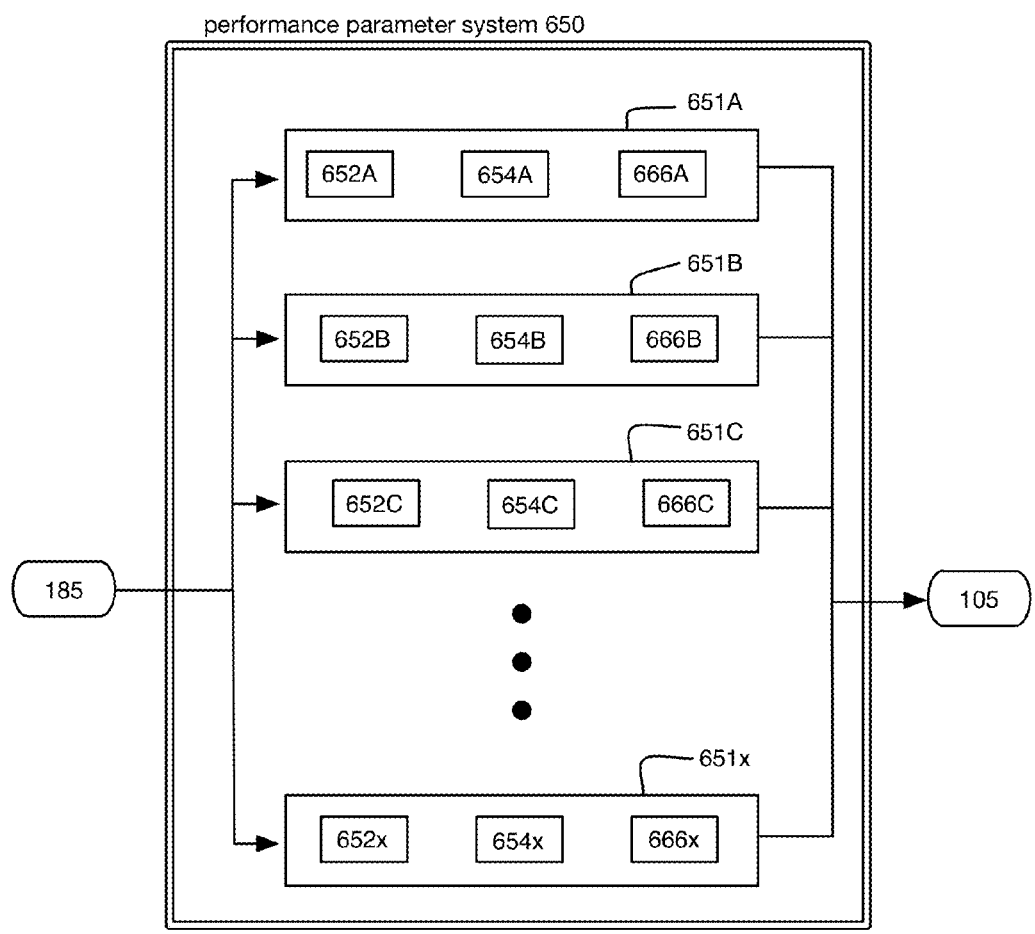
FIG. 6 is a block diagram of an exemplary performance parameter system of the photolithography system of FIG. 1.

Referring to FIG. 6, an exemplary performance parameter system 650 is shown that receives output from the control system 185 to control or modify one or more performance parameters associated with the light source 105. The performance parameter system 650 includes one or more performance parameter modules 651 (for example, 651A, 651B, 651C, . . . 651x). Depending on the performance parameter that is to be controlled, the specific performance parameter module 651 can be selected to modify or change that performance parameter of the light source 105. Each performance parameter module 651 can include its own controller (652A, 652B, 652C, . . . 652x) that includes electronics in the form of any combination of firmware and software. Each performance parameter module 651 can include its own set of actuation systems (654A, 654B, 654C, . . . 654x), which include actuators that are coupled to respective features (666A, 666B, 666C, . . . 666x) of the light source 105. The actuators can be any combination of mechanical, electrical, optical, thermal, hydraulic, for example, depending on the features of the light source to be controlled. By controlling these respective features (666A, 666B, 666C, . . . 666x) of the light source 105, the respective performance parameter can be adjusted.

While a set of performance parameter modules 651 is shown in FIG. 6, it is possible for the performance parameter system 650 to include only one performance parameter module or any number of performance parameter modules.

Figure 7A:
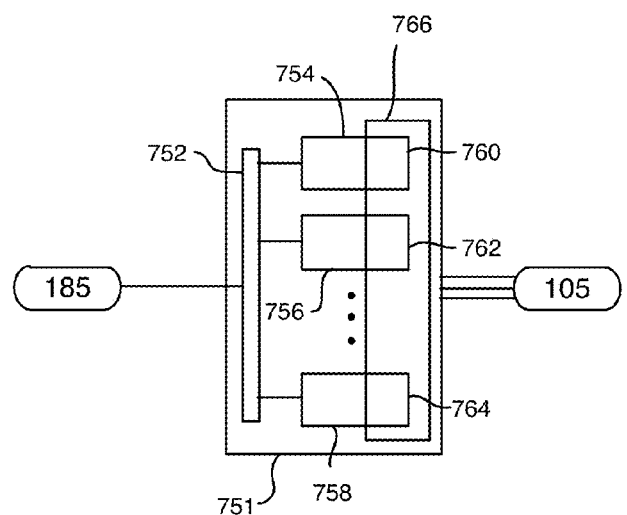
FIG. 7A is a block diagram of an exemplary performance parameter module of the performance parameter system of FIG. 6.

Referring to FIG. 7A, an example of a performance parameter module 651 that is a spectral feature module 751 is shown in block diagram form. The exemplary spectral feature module 751 couples to light from the light source 105. In some implementations, the spectral feature module 751 receives the light from the master oscillator 500 to enable the fine tuning of the parameters such as wavelength and bandwidth within the master oscillator 500.

The spectral feature module 751 can include a controller such as spectral feature controller 752 that includes electronics in the form of any combination of firmware and software. The controller 752 is connected to one or more actuation systems such as spectral feature actuation systems 754, 756, 758. While three actuation systems are shown, there can be fewer or greater than three actuation systems. Each of the actuation systems 754, 756, 758 can include one or more actuators that are connected to respective optical features 760, 762, 764 of an optical system 766. The optical features 760, 762, 764 are configured to adjust particular characteristics of the generated light beam 110 to thereby adjust the spectral feature of the light beam 110. The controller 752 receives a control signal from the control system 185 (as discussed below), the control signal including specific commands to operate or control one or more of the actuation systems 754, 756, 758. The actuation systems 754, 756, 758 can be selected and designed to work together, that is, in tandem. Moreover, each of the actuation systems 754, 756, 758 can be optimized to respond to a particular class of disturbances or modifications to the spectral feature. Together such coordination and cooperation can be employed by the control system 185 to hold or maintain the spectral feature (such as the wavelength or bandwidth) at a desired setpoint or at least within a desired range around a setpoint, even though the light source 105 may be subjected to a wide array disturbances. Or, the coordination and cooperation can be employed by the control system 185 to modify the spectral feature (such as the wavelength) to synthesize the spectral shape of the light beam 110 to form a synthesized spectral shape, as discussed below. Or, the coordination and cooperation can be employed by the control system 185 to modify the spectral feature (such as the bandwidth) to correct for errors in physical features formed on the wafer 120.

Figure 7B:
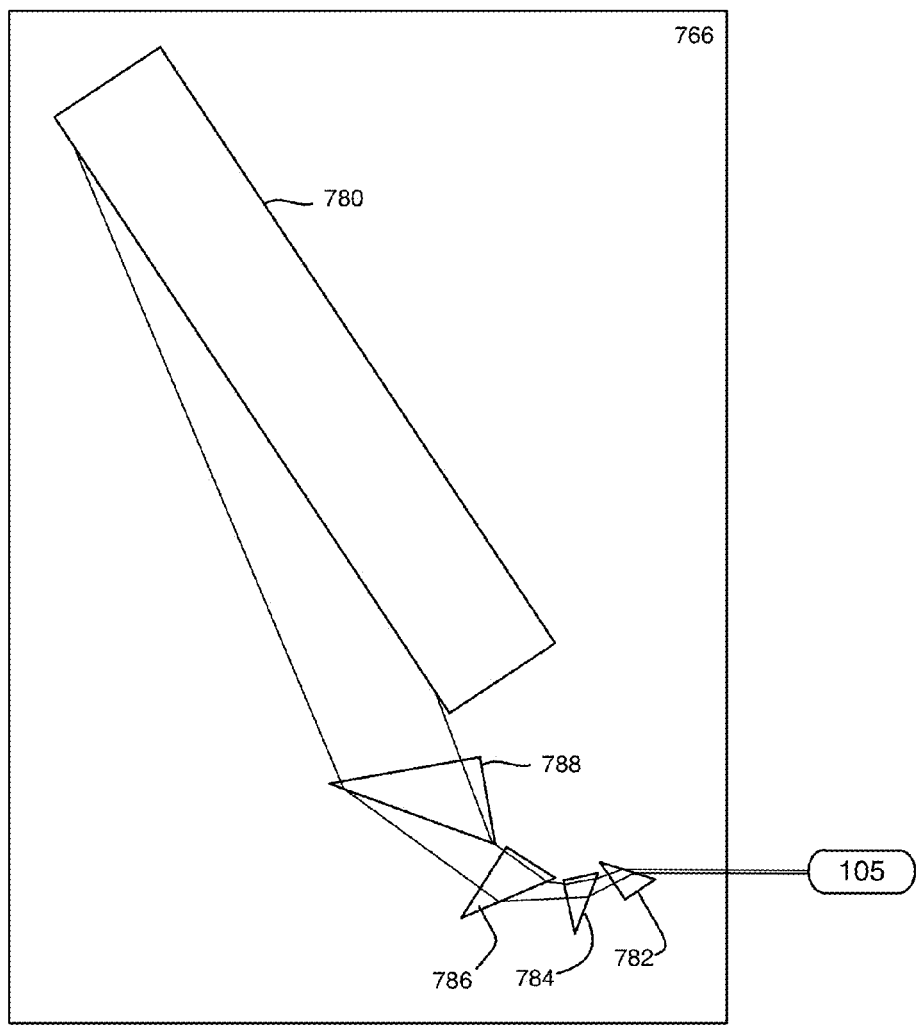
FIG. 7B is a block diagram of exemplary components of the performance parameter module of FIG. 7A.

Each optical feature 760, 762, 764 is optically coupled to the light beam 110 produced by the light source 105. In some implementations, the optical system 766 is a line narrowing module such as that shown in FIG. 7B, which is a block diagram of exemplary optical components of the spectral feature module 751 of FIG. 7A. The line narrowing module includes as the optical features 760, 762, 764 dispersive optical elements such as reflective gratings 780 and refractive optical elements such as prisms 782, 784, 786, 788, one or more of which can be rotatable. An example of this line narrowing module can be found in U.S. Pat. No. 8,144,739, entitled "System Method and Apparatus for Selecting and Controlling Light Source Bandwidth," and issued on Mar. 27, 2012 (the '739 patent), which is incorporated herein by reference in its entirety. In the '739 patent, a line narrowing module is described that includes a beam expander (including the one or more prisms 782, 784, 786, 788) and the dispersive element such as the grating 780. The respective actuation systems for the actuatable optical features such as the grating 780, and one or more of the prisms 782, 784, 786, 788 are not shown in FIG. 7B.

Each of the actuators of the actuation systems 754, 756, 758 is a mechanical device for moving or controlling the respective optical features 760, 762, 764 of the optical system. The actuators receive energy from the module 752, and convert that energy into some kind of motion imparted to the optical features 760, 762, 764 of the optical system. For example, in the '739 patent, actuation systems are described such as force devices (to apply forces to regions of the grating) and rotation stages for rotating one or more of the prisms of the beam expander. The actuation systems 754, 756, 758 can include, for example, motors such as stepper motors, valves, pressure-controlled devices, piezoelectric devices, linear motors, hydraulic actuators, voice coils, etc.

It is possible that the spectral feature selection system 750 includes only one actuation system coupled to one optical feature of the optical system, while the other optical features of the optical system remain unactuated. For example, in FIG. 7B, the line narrowing module can be set up so that only one of the prisms (such as the prism 782) is actuated by coupling with its actuation system, and the prism 782 can be movable under the control of a piezoelectric device. For example, the prism 782 can be mounted on a stage that is movable under the control of the piezoelectric device, which is controlled by the module 752.

Another type of performance parameter module 651 could be, for example, an energy module that controls the energy of the light beam 110 output from the light source 105. In some implementations, the energy is controlled by controlling a voltage to one or more of the gas discharge chambers (for example, to the gas discharge chamber in the master oscillator 500 or the gas discharge chamber of the power amplifier 510). In other implementations, the energy is controlled by adjusting a relative timing between the discharge in each of the master oscillator 500 and the power amplifier 510. In this case, the control system 185 receives the target value of the energy. Or, the monitoring module 140 monitors a deviation of the performance parameter from the target value, and the controller 117 adjusts the voltage and timing or other features within the light source 105 to modify and control the energy of the light beam 110.

Referring again to FIG. 1, the metrology apparatus 145 can be a self-contained system such as a high resolution scanning electron microscope (SEM) that is designed for high resolution imaging, to be able to display feature sizes of less than, for example 1 nm. The SEM is a type of electron microscope that produces images of a sample (in this case, the wafer 120) by scanning the wafer 120 with a focused beam of electrons. The electrons interact with atoms in the wafer 120, producing various signals that can be detected and that contain information about the wafer's surface topography and composition. The electron beam can be scanned in a raster scan pattern, and the electron beam's position is combined with the detected signal to produce an image. The SEM can achieve resolution better than 1 nanometer (nm). The wafer 120 can be observed in any suitable environment such as in high vacuum, in low vacuum, (in environmental SEM) in wet conditions and at a wide range of cryogenic or elevated temperatures. The most common mode of detection is by secondary electrons emitted by atoms excited by the electron beam. The number of secondary electrons is a function of the angle between the surface of the wafer 120 and the electron beam. In other systems, back-scattered electrons or x-rays can be detected.

For example, the SEM can be a CD-SEM that is specifically designed to image wafers. Suitable self-contained systems that can be used as the metrology apparatus 145 are VeritySEM™ produced by Applied Materials, Inc. of Santa Clara, Calif., USA, or the CG series CDSEMs (such as the CG5000) by Hitachi High-Technologies Corporation of Minato-ku, Tokyo, Japan.

In other implementations, the metrology apparatus 145 is a scatterometer that transmits a pulse of energy toward the wafer 120 and measures the reflected or diffracted energy from the wafer 120. The scatterometer can combine a measurement of overlay, focus, and CD in one sensor. In some implementations, the metrology apparatus 145 is the YieldStar S-250D (made by ASML Netherlands B.V. of Veldhoven, The Netherlands), which is a standalone metrology tool that allows measurement of on-product overlay and focus using diffraction based overlay and diffraction based focus techniques as well as the optional capability to measure CD.

In some implementations, the metrology apparatus 145 is an overlay metrology apparatus that determines whether the separate patterns of materials placed on each layer of the wafer 120 are aligned correctly. For example, the overlay metrology apparatus determines whether the contacts, lines, and transistors of each layer of the wafer line up with each other. Misalignment of any kind between the patterns can cause short circuits and connection failures, which in turn would impact yield and profit margins. Thus, in practice, the overlay metrology apparatus is used after each layer is formed on the wafer 120 but after the second layer is formed. The overlay metrology apparatus measures a relative position of the most recently formed (that is, the current) layer on the wafer to a previously formed layer on the wafer, where the most recently formed layer is formed on the previously formed layer. The relative position between the current wafer layer and the previously formed wafer layer is measured for each location at which the light beam exposes the wafer (if the characteristic of the light beam 110 measured at the wafer 120 corresponds to the location). An exemplary overlay metrology apparatus is the Archer™ 500 Series by KLA-Tencor Corporation of Milpitas, Calif., USA.

As discussed above, the monitoring module 140 provides, in real time, information 164 representative of how the light beam 110 scans the wafer 120 to the control system 185. The information is a characteristic of the light beam 110 as it exposes the wafer 120. In some implementations, the information can be used to determine the location at which the light beam 110 is exposing the wafer 120 during the exposure scan and therefore in real time; and this information can be provided periodically during a scan of the wafer, such as, for example, it can be provided for each field of the wafer, during a set number of times during a scan of the wafer, or during a set number of times within one field of the wafer.

Figure 8A:
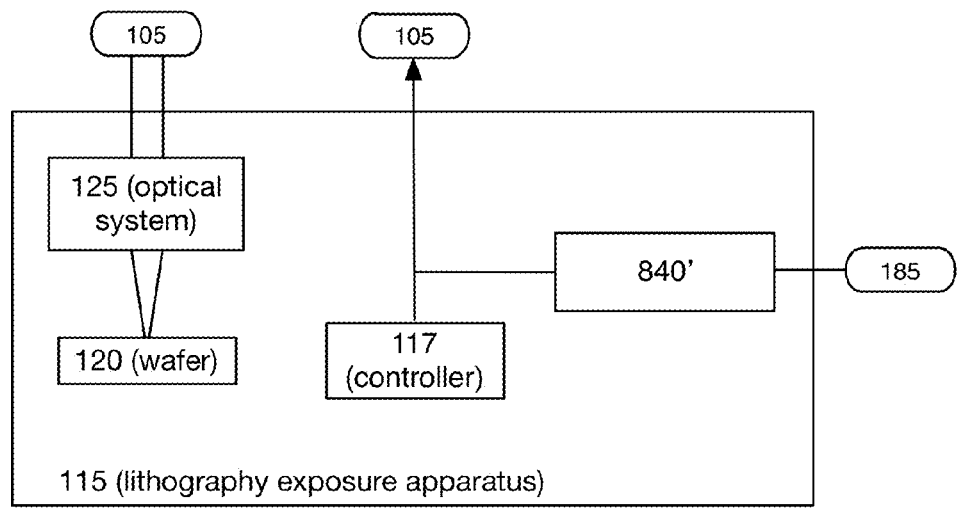
FIGS. 8A and 8B are block diagrams of exemplary monitoring modules that can be used in the lithography exposure apparatus of FIG. 1.

Referring to FIG. 8A, in some implementations, the monitoring module 140 includes a signal monitor 840' positioned to monitor or observe one or more signals that are sent from the controller 117 (of the lithography exposure apparatus 115) to the light source 105. For example, with reference again to FIG. 3, the signal monitor 840' may be configured to detect one or more of the following exemplary signals: when the wafer exposure signal 300 is at a high value 305; when the gate signal 315 is at a low value 325; when the trigger signal 330 is at a low value and the gate signal 315 is at a high value 320; when the wafer exposure signal 300 switches from the high value 305 to the low value 310; or when the trigger signal 330 switches to a low value after being at a high value a certain number of times (such as the number of times that corresponds to the slit).

Figure 8B:
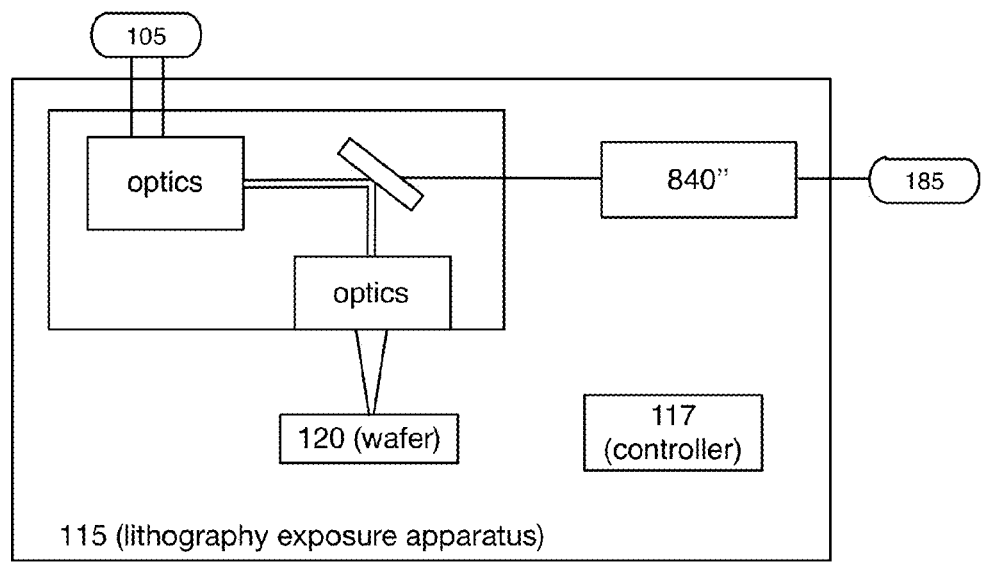

Referring to FIG. 8B, in other implementations, the monitoring module 140 includes an energy or power sensor 840" positioned within the lithography exposure apparatus 115 to detect an energy of the light beam 110 just before it exposes the wafer 120. The sensor 840" can be, for example, a photodiode power sensor, a thermal power sensor, or a pyroelectric energy sensor. The sensor 840" can be positioned at an optical element on which the light beam 110 reflects on its path between the light source 105 and the wafer 120.

Figure 9:
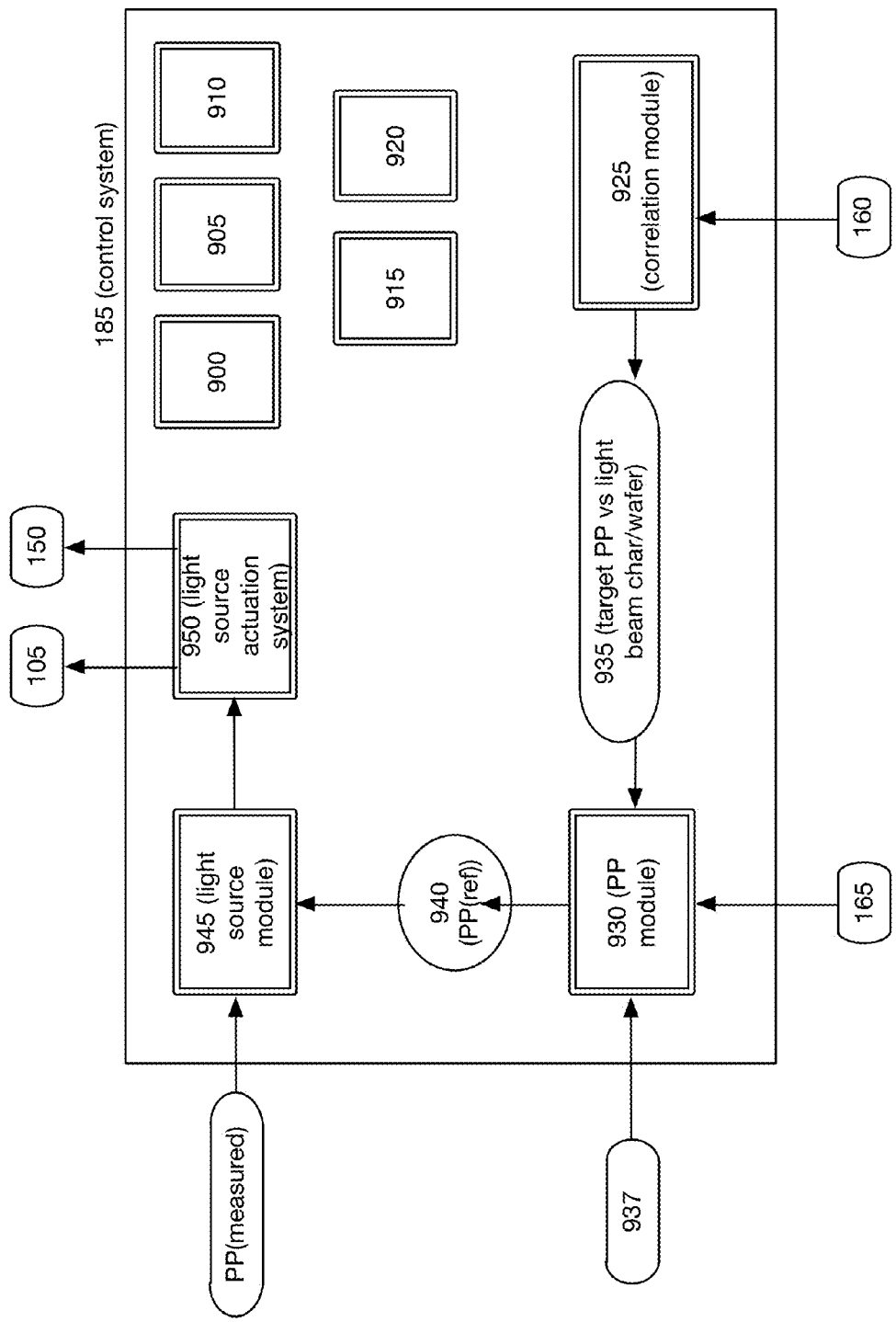
FIG. 9 is a block diagram of an exemplary control system of the photolithography system of FIG. 1.

Referring to FIG. 9, details about the control system 185 are provided that relate to aspects of the system and method described herein. The control system 185 can include other features not shown in FIG. 9. In general, the control system 185 includes one or more of digital electronic circuitry, computer hardware, firmware, and software.

Specifically, the control system 185 includes memory 900, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 185 can also include one or more input devices 905 (such as a keyboard, touch screen, microphone, mouse, hand-held input device, etc.) and one or more output devices 910 (such as a speaker or a monitor).

Generally, the control system 185 includes one or more programmable processors 915, and one or more computer program products 920 tangibly embodied in a machine-readable storage device for execution by a programmable processor (such as the processors 915). The one or more programmable processors 915 can each execute a program of instructions to perform desired functions by operating on input data and generating appropriate output. Generally, the processor 915 receives instructions and data from the memory 900. Any of the foregoing may be supplemented by, or incorporated in, specially designed ASICs (application-specific integrated circuits).

Specifically, the control system 185 includes a correlation module 925 (which can be a set of computer program products executed by one or more processors such as the processors 915) and a performance parameter module 930 (which can be a set of computer program products executed by one or more processors such as the processors 915). The correlation module 925 receives the output 160 from the detection system 155 within the metrology apparatus 145. The performance parameter module 930 receives the real-time information 165 about how the light beam 110 scans the wafer 120 from the monitoring module 140, information 935 that outputted from the correlation module 925, and a target value 937 of the performance parameter. The control system also includes a light source module 945 and a light source actuation system 950. The light source module 945 receives a target performance parameter 940 from the performance parameter module 930 and a measured value of the performance parameter from the measurement system 180. The output of the light source module 945 indicates to the light source actuation system 950 how to adjust features of the light source 105. The light source actuation system 950 is connected to the light source 105 and to the performance parameter system 150.

While FIG. 9 represents the control system 185 as a box in which all of the components appear to be physically co-located, it is possible for the control system 185 to be made up of components that are physically remote from each other. For example, the light source module 945 and the light source actuation system 950 can be physically co-located with the light source 110; the correlation module 925 can be a separately contained computer remote from the light source module 945 and the memory 900 and processors 915.

Figure 10:
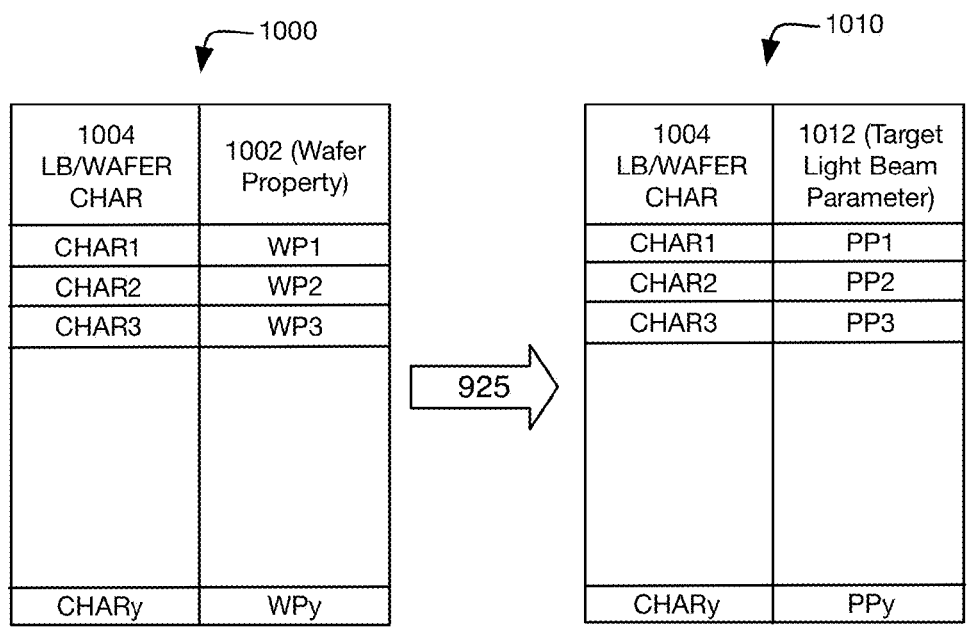
FIG. 10 shows an exemplary list that is received by a correlation module within the control system of FIG. 9 and an exemplary list that is output by the correlation module.

Referring to FIG. 10, the output 160 received by the correlation module 925 is a list 1000 of the measured physical properties 1002 of the wafer 120 for each pulsed light beam characteristic 1004 at the wafer. Examples of measured physical properties 1002 of the wafer 120 include a contrast of a feature formed on the wafer, a linewidth or critical dimension (CD) at the wafer location, a photoresist profile, a sidewall angle, and a final resist thickness. The physical property 1002 can be analyzed within the context of a curve or plot (such as a Bossung curve) of the physical property versus a property (such as focus or dose) of the light beam that exposes the wafer 120.

Figure 11:
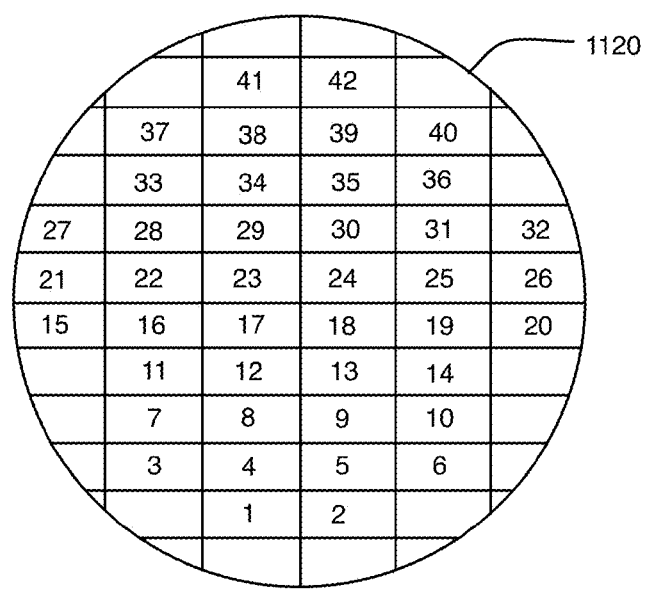
FIG. 11 is a diagram of an exemplary wafer that can be imaged using the photolithography system of FIG. 1.

The pulsed light beam characteristic 1004 at the wafer can be a location at which the light beam exposes the wafer 120. In this case, the output 160 is a list 1000 of the measured physical properties 1002 of the wafer 120 for each location 1004 on the wafer. Referring also to FIG. 11, the location can be taken at each exposure field of an exemplary wafer 1120 and in this example, each exposure field is marked with a consecutive number so that there are 42 fields on the wafer 1120. Thus, the detection system 155 measures the physical property 1002 at each field on the wafer 1120 within the metrology apparatus 145. The correlation module 925 outputs a list 1010 that correlates performance parameters 1012 of the light beam 110 with each pulsed light beam characteristic 1004. The correlation module 925 determines the performance parameter 1012 of the light beam 110 that would modify or correct the physical property 1002 at the particular pulsed light beam characteristic 1004. For example, if the characteristic 1004 is a location on the wafer 1120, and the measured physical property 1002 is an error in CD, the correlation module 925 may determine how to adjust a bandwidth (performance parameter) of the light beam 110 to compensate for the error in CD at each location on the wafer 1120. The created list 1010 is the information 935 sent to the performance parameter module 930. The correlation module 925 therefore can determine how to adjust one or more performance parameters of the pulsed light beam 110 to compensate for the physical errors that show up on the wafer 120, without modifying characteristics (such as optical characteristics) or components within the lithography exposure apparatus 115.

Figure 12:
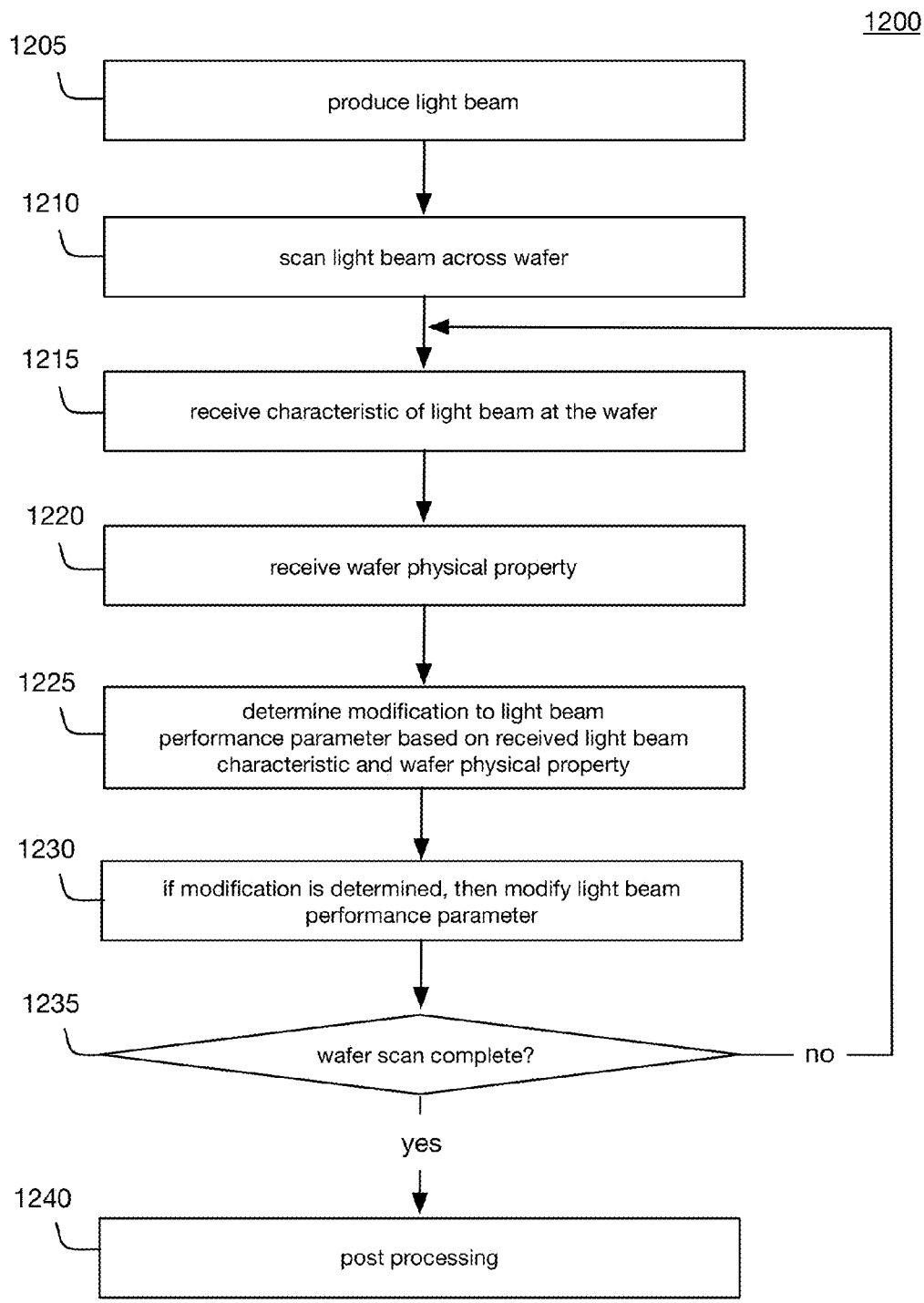
FIG. 12 is a flow chart of a procedure for adjusting physical properties at the wafer by adjusting performance output from the light source of the photolithography system of FIG. 1.

Referring to FIG. 12, the photolithography system 100 performs a procedure 1200 for adjusting physical properties at the wafer by modifying or adjusting the performance output from the light source on an intra-wafer (for example, field-to-field) or an intra-field (for example, pulse-to-pulse) basis. One or more of the steps of the procedure 1200 can be performed by the control system 185 and/or the controller 117.

Initially, a signal is sent to the light source 105 to produce the light beam 110 as a set of pulses (1205). For example, the light source module 945 can be configured to receive one or more of the wafer exposure signal 300, the gate signal 315, and the trigger signal 330 from the controller 117, and based on the values of these signals, instruct the light source actuation system 950 to actuate features of the light source 105 produce the light beam 110 in the bursts of pulses. The produced light beam 110 is scanned across the wafer 120 (1210). For example, the controller 117 and the control system 185 can coordinate the production of the pulsed light beam 110 with the components within the lithography exposure apparatus 115 to move one or more of the mask 234, the objective arrangement 232, and the wafer 120 relative to each other during the exposure to scan the exposure window 200 across the exposure field 210 of the wafer 120 so that N pulses illuminate each field of the wafer 120.

While the light beam 110 is being scanned across the wafer 120 (1210), the control system 185 (and in particular, the performance parameter module 930) receives the information 165 from the monitoring module 140, which is the characteristic of the pulsed light beam 110 at the wafer 120 at a step in time during the scanning (1215). Thus, for example, the control system 185 receives a value that represents the location of the pulsed light beam 110 at that step in time during the scanning, for example for a particular pulse within an exposure field or for a particular exposure field of the wafer. The step in time can be within the time of a single pulse if it is desired to control the performance parameter on a pulse-to-pulse basis. The step in time can be within the time of a single exposure field (and thus, can last for N number of pulses, which can be about 100 pulses). The step in time can be within the time of a single slit, which has a plurality of pulses but is less than the size of the exposure field, and thus can last for some value between 1 and a number that is a fraction of the N number of pulses within the field.

In the example in which control is on a field-to-field bases, if the monitoring module 140 is designed like the monitoring module 840' of FIG. 8A, then the control system 185 can receive a signal from the monitoring module 840' that indicates that the gate signal 315 switched to the low value 325 from the high value 320. Such information means that the light beam 110 is at the end of the exposure field on the wafer 120 and thus it provides the control system 185 with information about the location of the light beam 110 relative to the wafer 120. As another example in which control is on a pulse-to-pulse basis, the control system 185 can receive a signal from the monitoring module 840' that indicates that the trigger signal 330 just switched from a high value to a low value and the gate signal 315 is at a high value 320. This information means that the pulse of the light beam 110 has ended within the current exposure field.

The control system 185 (and specifically, the correlation module 925) receives the output 160 from the detection system 155, that is, the determined value 1002 of the physical property of the wafer 120 for a particular light beam characteristic 1004 (1220). In general, the determined values 1002 of the physical properties of the wafer 120 for each light beam characteristic 1004 is received as the list 1000, which is in the output 160 from the metrology apparatus 145 and is based on an analysis and measurement of previously-exposed wafers. It is possible that the metrology apparatus 145 is integrated within the lithography exposure apparatus 115 so that it measures the physical property of the wafer 120 in real time and during the exposure of the current wafer 120 mounted on the stage 220.

The control system 185 (and specifically, the performance parameter module 930) determines whether and how much to modify the performance parameter of the light beam 110 based on the received information 165 (the characteristic of the pulsed light beam 110 at the wafer 120) from the monitoring module 140 (1215) and the received determined value 1002 of the physical property of the wafer 120 for the particular light beam characteristic 1004 from the detection system 155 (1220) (1225). The control system 185 modifies the performance parameter of the pulsed light beam 110 during the scanning across the wafer 120 (1230) if the control system determines that the performance parameter needs to be modified (1225). In particular, the control system 185 can modify the performance parameter of the pulsed light beam 110 after the current time step before the next time step. If the time step is an entire pulse of the light beam 110, then the modification of the performance parameter can occur after the current pulse but before the next pulse of the light beam 110 is emitted. If the time step is an entire field, then the modification of the performance parameter can occur after the current exposure field is completed but before the next exposure field begins. Thus, with reference to FIG.

3, for example, if the time step is an entire field F, then the modification can occur at time T(mod), which is the time between two exposure fields of the wafer 120.

The control system 185 determines whether the scanning of the wafer 120 is complete (1235). For example, the control system 185 (specifically, the performance parameter module 930) can receive a signal from the monitoring module 840' that indicates that the wafer exposure signal 300 has switched from a high value 305 (which indicates that the wafer is being exposed) to a low value 310, which indicates the end of the wafer exposure. If the signal from the monitoring module 840' is the high value 305 then the scanning of the wafer 120 is not complete (1235) and scanning continues (1210). If the signal from the monitoring module 840' indicates that the wafer exposure signal 300 has switched to the low value 310 from the high value 305, then the scanning of the wafer 120 is complete 1235 and post processing of the wafer 120 is performed offline (1240).

Figure 13:
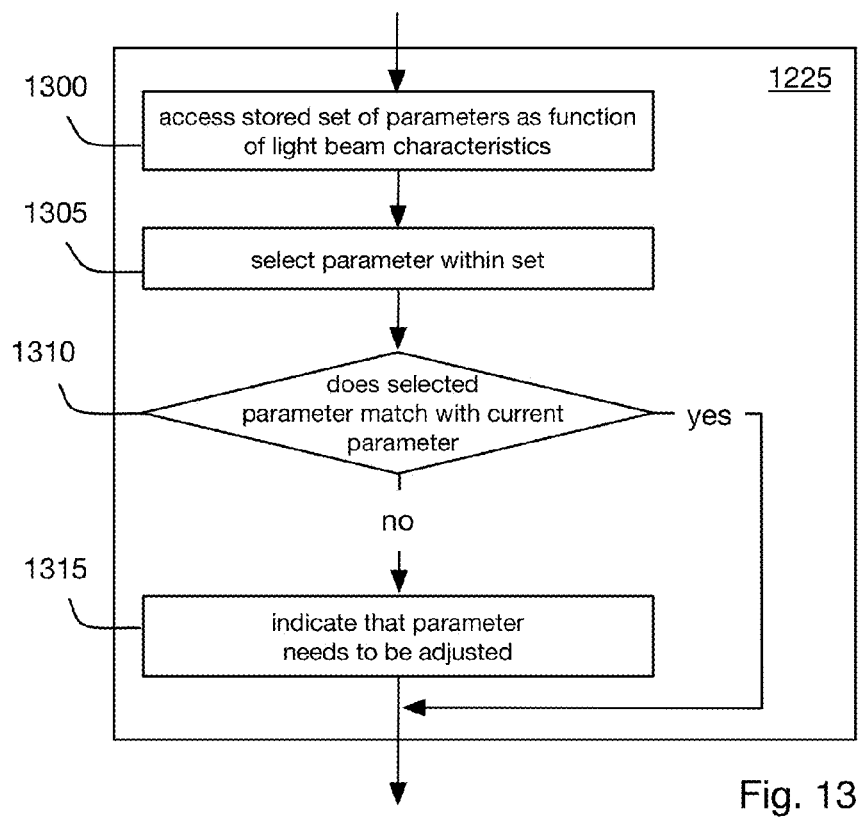
FIG. 13 is a flow chart of a procedure for determining whether and how to modify a performance parameter of the light beam based on the received characteristics of the light beam at the wafer and the measured physical property of the wafer for the particular light beam characteristic.

Referring to FIG. 13, the control system 185 can perform a procedure 1225 for determining whether and how much to modify the performance parameter of the light beam 110 based on the received characteristic of the pulsed light beam 110 at the wafer 120 (1215) and the received determined value 1002 of the physical property of the wafer 120 for the particular light beam characteristic 1004 (1220). The control system 185 (specifically, the performance parameter module 930) accesses the list or set of performance parameters as a function of light beam characteristics at the wafer (which is produced by the correlation module 925) (1300); selects the value for the performance parameter within the accessed set that corresponds to the received characteristic of the light beam (from the monitoring module 140) at the current wafer 120 (1305); and compares the selected value of the performance parameter with a current measured value 937 of the performance parameter of the pulsed light beam 110 (1310). Additionally, if the selected value of the performance parameter does not match the current value, then the control system 185 (specifically, the performance parameter module 930) determines that the current target performance parameter needs to be adjusted to match the selected value of the performance parameter (1315).

Figure 14:
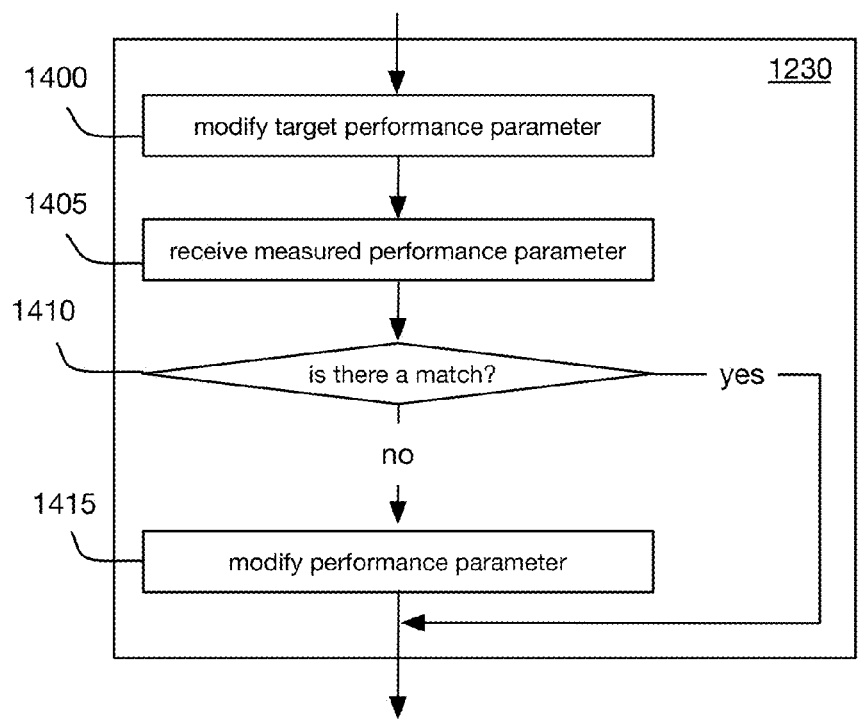
FIG. 14 is a flow chart of a procedure for modifying the performance parameter of the light beam.

Referring to FIG. 14, the performance parameter of the pulsed light beam can be modified (1230) by performing a procedure 1230. The control system 185 (specifically, the performance parameter module 930) modifies a target performance parameter of the light beam 110 (1400). The control system 185 (specifically, the light source module 945) receives a measurement of the performance parameter of the pulsed light beam 110 from the measurement system 180 (1405), and determines whether the measured performance parameter matches the modified target performance parameter 940 (1410). The measured performance parameter can be considered to match the modified target performance parameter if it is equal to the modified target performance parameter or if the difference between the measured performance parameter and the modified target performance parameter is less than a predetermined threshold.

For example, in certain applications in which the performance parameter is the bandwidth of the light beam 110, the bandwidth (measured using the E95 metric) can be controlled to within ±30 femtometer (fm) around a target bandwidth. As another example, in certain applications in which the performance parameter is the average wavelength error of the light beam 110, the wavelength error can be controlled to within ±6 fm around a target wavelength error. As a further example, in certain applications in which the performance parameter is the energy stability (for example an energy error) of the light beam 110, the energy error can be controlled to within 4% of a target energy error.

If the control system 185 (specifically, the light source module 9450 determines that the measured performance parameter does not match the modified target performance parameter (1410), then the control system 185 sends a signal to the light source 105 by way of the light source actuation system 950 to modify the performance parameter of the pulsed light beam 110 (1415).

By performing the procedure 1200, errors in patterning at the wafer 120 can be corrected by modifying the performance parameter of the light beam 110 without modifying features of or optical components within the lithography exposure apparatus 115.

Figure 15A:
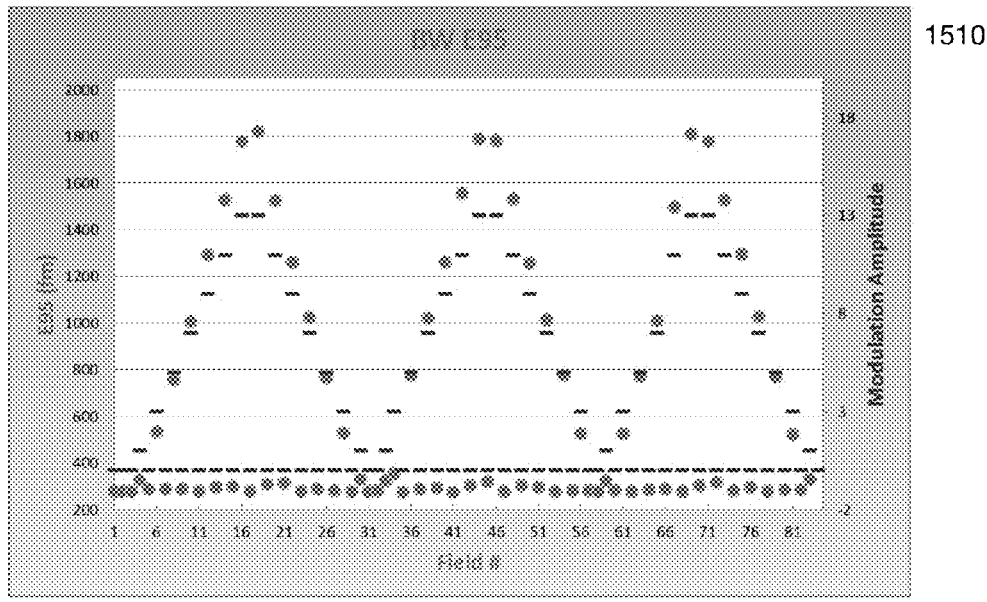
FIG. 15A is a graph showing how the light beam performance parameter (bandwidth) is controlled using the procedure of FIG. 12.
Figure 15B:
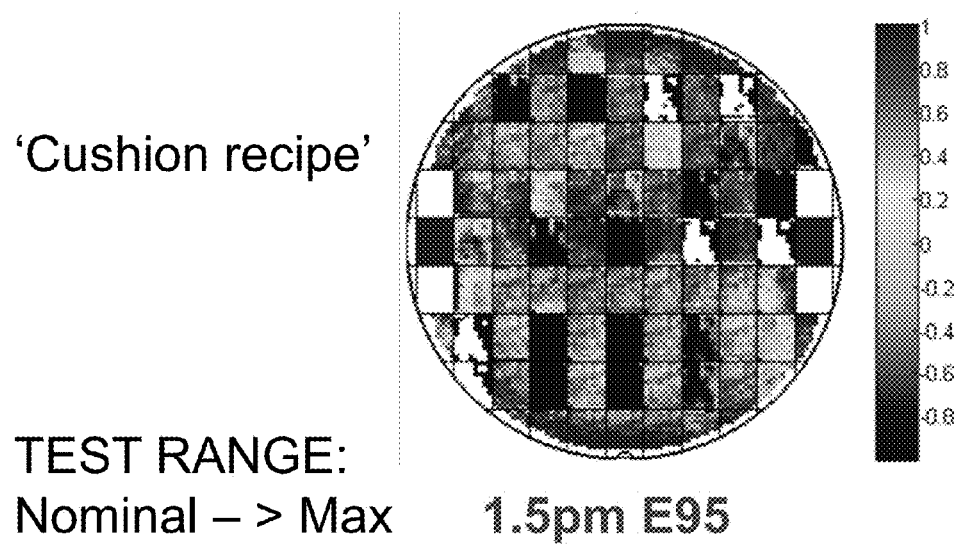
FIG. 15B is a chart showing how a measured physical property on the wafer varies as the bandwidth is modified at each field.

Referring to FIGS. 15A and 15B, in some implementations, the light beam performance parameter that is controlled using the procedure 1200 is a bandwidth (measured or characterized using a suitable metric such as the spectral width that contains X % of the integrated energy of the laser pulse energy or EX, where X can be 95) of the light beam 110 and it is controlled on a field-to-field basis (which means that the time steps in the procedure occur with each exposure field). In this example, the bandwidth of the light beam 110 is adjusted for each field of the wafer 120. In FIG. 15A, an exemplary list 1010 of the bandwidth 1012 correlated to exposure field 1004 that is output from the correlation module 925 is shown in a graph 1510. In FIG. 15B, the measured physical property (for example, the critical dimension) for each exposure field 1004 of a previously-exposed wafer 120 is shown in a wafer schematic in which the color corresponds to the value of the critical dimension, which varies from a nominal value of zero, 0, the color green, for each exposure field. The data for FIG. 15B was taken by the metrology apparatus 145 for wafers 120 exposed with the light source 110 operating with a bandwidth that varied from 300 fm to 1600 fm, with the value of the bandwidth changing for each field of the wafer such as shown in FIG. 15A. For those fields that are red or blue, the critical dimension is off from the nominal value. This information can be used to determine how to adjust the bandwidth to offset a measured physical property at the wafer. The list 1010 (represented in FIG. 15A) shows how the bandwidth 1012 needs to be adjusted for each exposure field to modify or correct the critical dimension 1002 at each field of the wafer 120.

Figure 16:
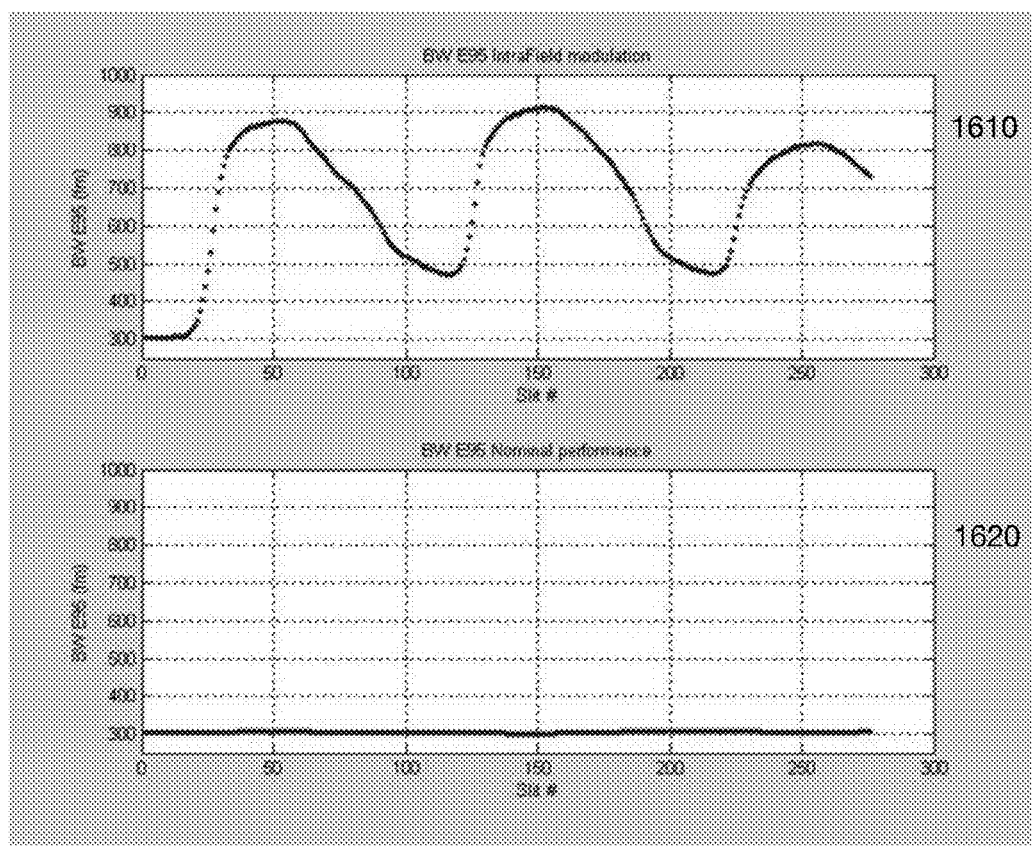
FIG. 16 is a set of graphs, the top graph showing how a light beam performance parameter is varied for each slit number using the procedure of FIG. 12 and the bottom graph showing the light beam performance parameter which is not varied using the procedure of FIG. 12.

Referring to FIG. 16, in some implementations, the light beam performance parameter that is controlled using the procedure 1200 is the bandwidth of the light beam 110 and it is controlled on an intra-field (for example, a slit-to-slit) basis, which means that the time steps in the procedure occur at each slit of the field. The top graph shows a graph 1610 that represents an exemplary list 1010 that is output from the correlation module 925 while the bottom graph 1620 shows the bandwidth behavior without any modification or adjustment from the performance parameter module 930. In this graph 1610, the performance parameter of the bandwidth 1012 is correlated with each exposure slit of a field of the wafer 120. This shows how the bandwidth 1012 needs to be adjusted for each exposure field to modify or correct some physical property 1002 at each field of the wafer 120.

Referring to FIG. 17A, in some implementations, the light beam performance parameter that is controlled using the procedure 1200 is an energy of the light beam 110 and it is controlled on a field-to-field basis (which means that the time steps in the procedure occur with each exposure field). In this example, the energy of the light beam 110 is adjusted for each field of the wafer 120. In FIG. 17A, an exemplary list 1010 of the energy 1012 correlated to exposure field 1004 that is output from the correlation module 925 is shown in a graph 1710. This list 1010 shows how the energy 1012 needs to be adjusted for each exposure field to modify or correct the critical dimension 1002 at each field of the wafer 120.

In FIGS. 17B, C, and D the measured physical property (for example, the critical dimension) for each exposure field 1004 of a previously-exposed wafer 120 is shown in a set of wafer schematics in which the color corresponds to the value of the critical dimension, which varies from a nominal value of zero, 0, the color green, for each exposure field. The data for FIG. 17B was taken by the metrology apparatus 145 for wafers 120 previously exposed with the light source 110 operating with a bandwidth that ranged from 300 fm to 600 fm (measured using the E95 metric); the data for FIG. 17C was taken by the metrology apparatus 145 for wafers 120 previously exposed with the light source operating at a bandwidth that ranged from 300 fm to 800 fm (measured using the E95 metric), and the data for FIG. 17D was taken by the metrology apparatus 145 for wafers 120 previously exposed with the light source operating at a bandwidth that ranged from 300 fm to 900 fm (measured using the E95 metric). The value of the bandwidth changes for each field of the wafer such as shown in FIG. 15A. For those fields that are red or blue, the critical dimension is off from the nominal value.

Figure 18:
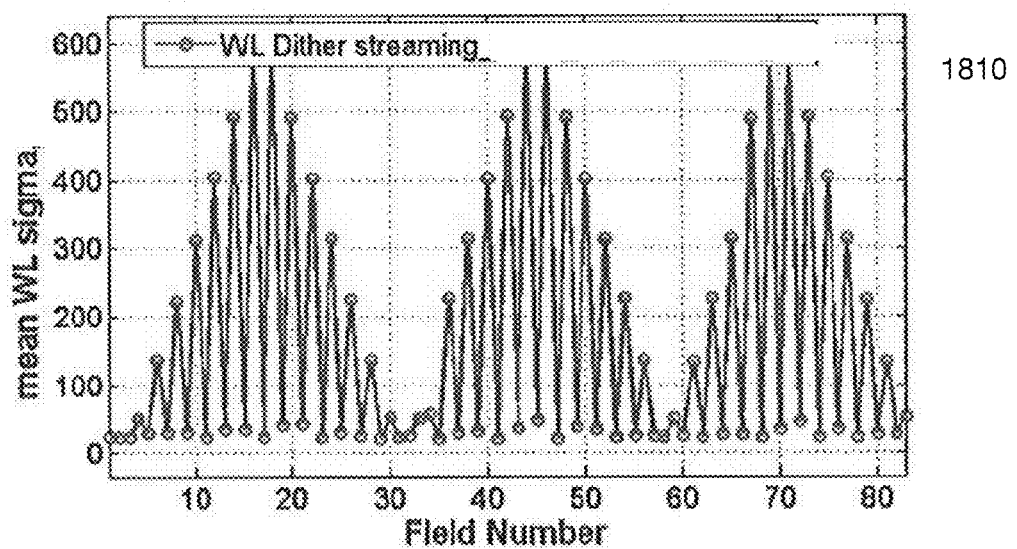
FIG. 18 is a graph showing how the light beam performance parameter (wavelength error) is varied for each field number of the wafer using the procedure of FIG. 12.

Referring to FIG. 18, a graph 1810 shows the adjustment or variance of the performance parameter of an error in wavelength (in arbitrary units such as fm) of the light beam 110 on a field-to-field basis (or intra-wafer basis) using the procedure 1200. Each data point of the graph 1800 represents a burst or field and shows how the wavelength error is adjusted to correct errors in a physical property (such as the critical dimension) at the wafer 120.

Figure 19:
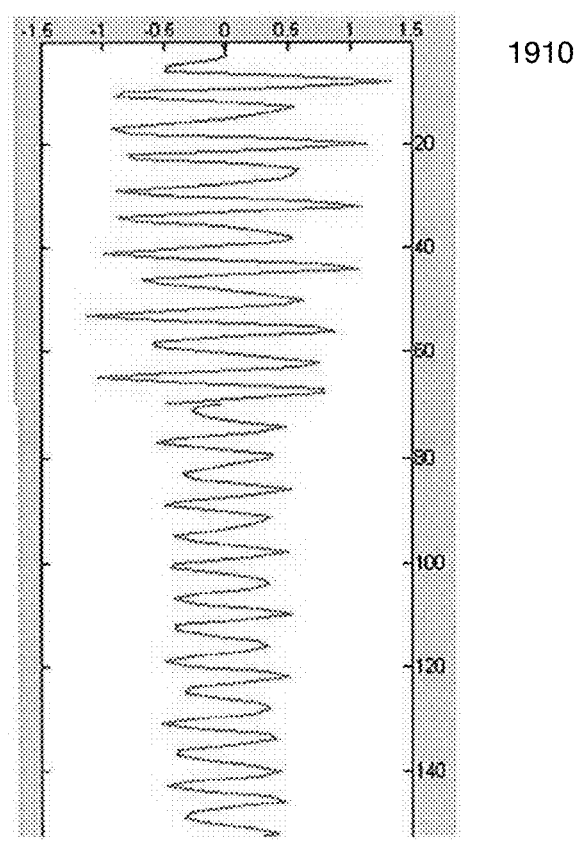
FIG. 19 is a graph showing how the light beam performance parameter (wavelength error) is varied for each pulse of the light beam at the wafer using the procedure of FIG. 12.

Referring to FIG. 19, a graph 1910 shows the adjustment or variance of the performance parameter of an error in wavelength of the light beam 110 on a pulse-to-pulses basis (or intra-field basis). The vertical axis represents the pulse number within a field and the horizontal axis represents the wavelength error (from a zero value in the center). Each data point of the graph 1910 represents a pulse, and shows how the wavelength error is adjusted to correct errors in a physical property (such as the critical dimension) at the wafer 120. As evident from the graph 1910, the wavelength error tends to be greater for pulses forming in the first half of the field while the wavelength error tends to be reduced for the second half of the field.

Figure 20A:
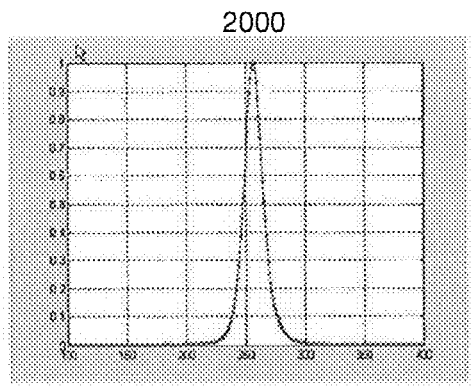
FIGS. 20A and 20B are respective graphs of spectral shapes of the light beam taken at distinct locations or times during exposure of the wafer with the light beam.
Figure 20B:
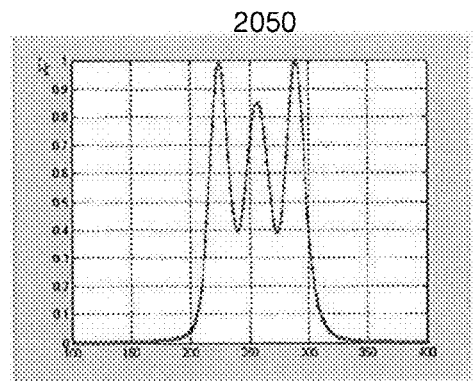

Referring to FIGS. 20A and 20B, respective graphs 2000, 2050 show how the spectral shape (one performance parameter) of the light source 110 is modified or adjusted throughout a wafer scan to account for certain variations in physical properties at the wafer 120. For example, the spectral shape can be maintained throughout one burst or it can be changed with each burst or it can be changed with each pulse or each slit. The graphs 2000, 2050 show two examples of spectral shapes, but many others can be achieved. The spectral shape can be adjusted by changing a phase of the optical spectrum 400; the phase is a distance between peaks of the wavelengths produced by spectrum synthesis. By changing the distance between the wavelength peaks, the shape of the spectrum can be modified across the wafer 120.

Figure 21:
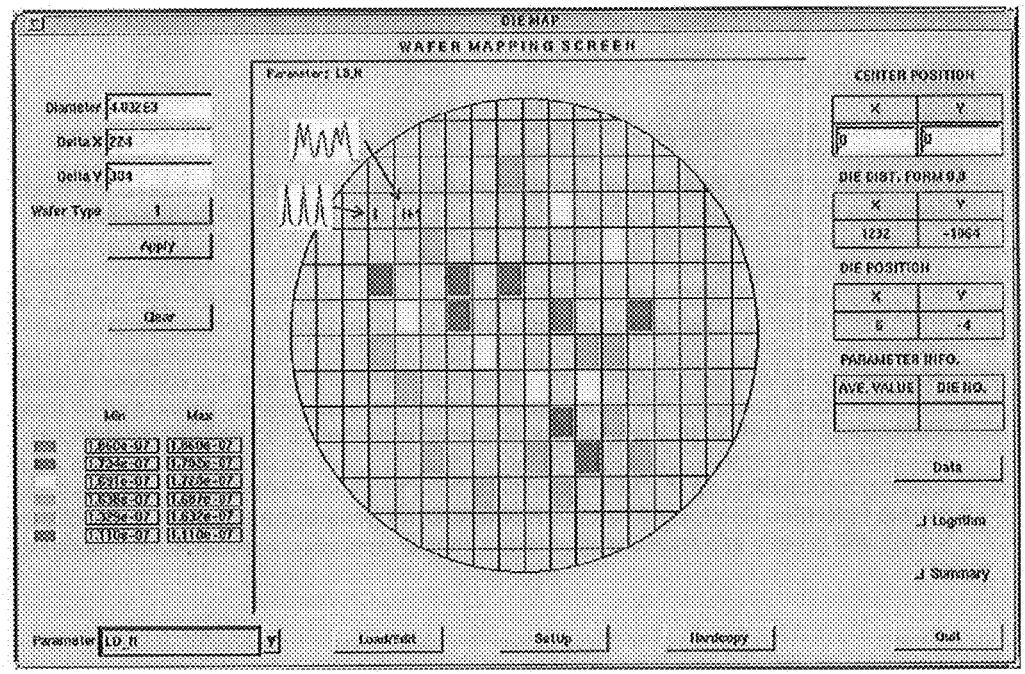
FIG. 21 is an exemplary wafer map in which a phase of the optical spectrum of the light beam is modified to thereby modify the spectral shape of the light beam on a field-to-field basis.

Referring also to FIG. 21, an exemplary wafer map is shown in which a phase of the spectrum is modified. At the beginning of a wafer exposure, the laser receives a reset bit (the wafer exposure signal 300) from the controller 117 (in the lithography exposure apparatus 115) prior to the first trigger signal 330 of the first burst (field). At the beginning of each field exposure (burst), the light source 110 receives a number of pulse information from the controller 117 prior to the first trigger signal 330 of that burst. The laser software (which can be in the control system 185) can then calculate and determine the amplitude A of the wavelength modification, the phase offset φ, and the dither period N to generate the most appropriate spectrum for the immediate next field based on the illumination requirements at the wafer 120.

The timing between receiving information and the first trigger signal is properly budgeted to allow for sufficient time for the control system 185 to complete its calculation and analysis. In this way, each field (for example, i and i+1 in FIG. 21) can have completely different spectrums, providing illumination flexibility in a pulse-to-pulse or a field-to-field basis. At the end of each field, for example, within T(mod) seconds, all information about the light source 110, and the conditions for triggering the light source 110 in the field are sent to the light source module 945 and are properly processed and recorded for example, within memory 900. The recorded information can be further used for either online or offline intra-wafer and inter-wafer characterization.

The procedure 1200 can be enabled and disabled through the control system 185 or through a part of the control system 185 dedicated to the light source 105. This procedure 1200 can be used for wafer characterization and wafer-to-wafer spectrum trend control. This procedure 1200 can be used for inter-field or intra-field closed loop spectrum control. The current burst's spectrum can be adapted based on the calculation of last burst's information.

In this way, the spectrum is generated on a field-to-field or a wafer-to-wafer basis. And, there is adaptive control of the spectrum shape on a field-to-field and wafer-to-wafer basis.

Figure 22A:
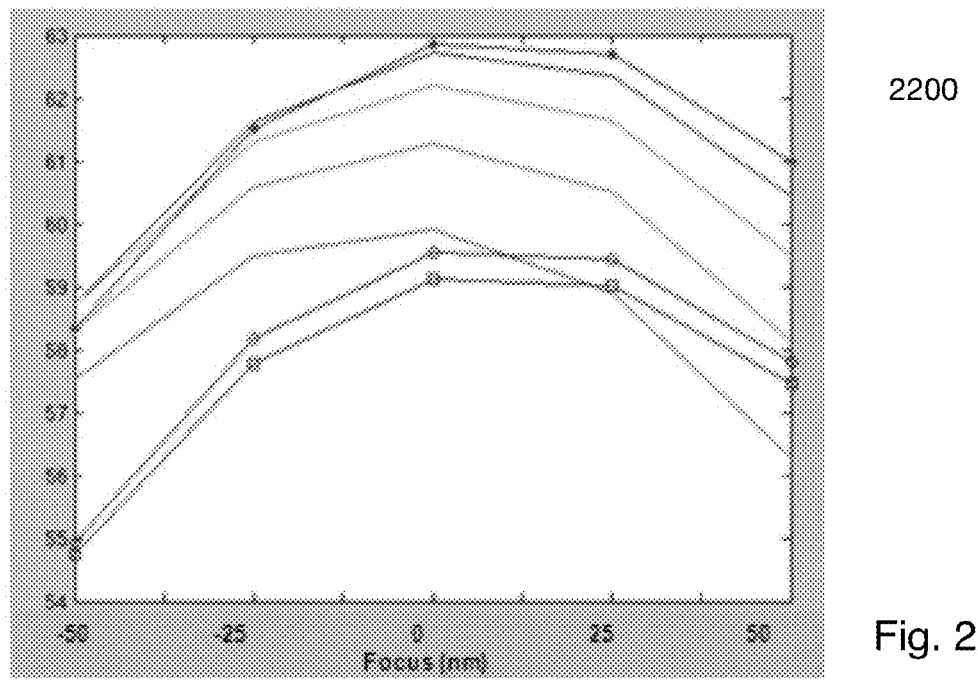
FIGS. 22A and 22B are graphs showing how a physical property (critical dimension) of the wafer varies versus a performance parameter (a focus) of the light beam.
Figure 22B:
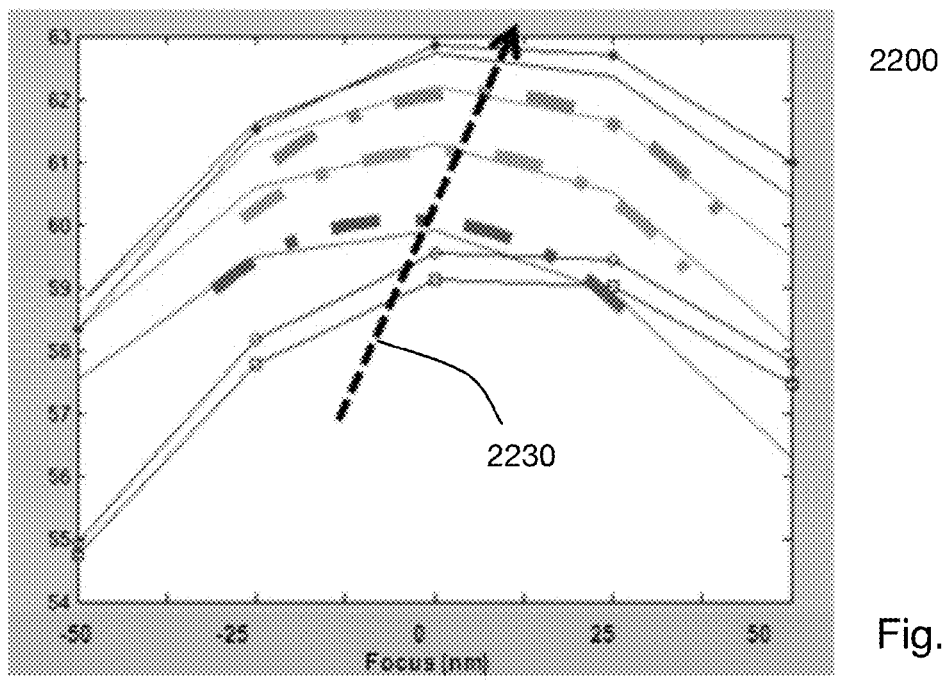

Referring also to FIG. 22A, a graph 2200 shows the critical dimension (a physical property 1002) at the wafer 120 versus a focus of the light beam 110 (a light beam parameter 1012). This graph 2200 is typically referred to as a Bossung curve, which enables the analysis of a variation in critical dimension of a printed feature versus the focus latitude and the exposure latitude. The graph 2200 shows a set of plots that have symbols (such as squares or circles) and these plots were generated with symmetrical optical spectra 400. On the other hand, the set of plots shown in the graph 2200 that lack symbols were generated with asymmetrical optical spectra 400. The graph 2200 is duplicated in FIG. 22B, but a line 2230 has been added to show that the plots generated with asymmetrical optical spectra 400 are tilted. In this way, Bossung tilt or shift is induced by modifying the shape of the optical spectra 400.

What is claimed is:
1. A photolithography method comprising:
   instructing an optical source to produce a pulsed light beam;
   scanning the pulsed light beam across a wafer of a lithography exposure apparatus to expose the wafer with the pulsed light beam;
   detecting a property of the pulsed light beam at the wafer as the pulsed light beam is scanned across the wafer;
   during scanning of the pulsed light beam across the wafer, receiving the property of the pulsed light beam at the wafer;
   determining a value of a physical property of a wafer that correlates with the received pulsed light beam property by selecting the value of the physical property of the wafer based on the received pulsed light beam property;

determining a modification to a performance parameter of the pulsed light beam based on the pulsed light beam property that is received during scanning and the determined value of the wafer physical property; and modifying the performance parameter of the pulsed light beam during scanning across the wafer based on the determined modification.

2. The method of claim 1, wherein the determined value of the wafer physical property comprises an error in the physical property of the wafer.

3. The method of claim 1, wherein the wafer physical property is one or more of a contrast of a feature formed on the wafer, a critical dimension at a wafer area exposed to the pulsed light beam, a photoresist profile at a wafer area exposed to the pulsed light beam, and a side-wall angle at a wafer area exposed to the pulsed light beam.

4. The method of claim 1, wherein determining the value of the physical property of the wafer that correlates with the received pulsed light beam property comprises receiving a set of determined values of the physical property for a wafer that has been previously exposed by the light beam of the optical source for a set of light beam properties on the previously-exposed wafer.

5. The method of claim 1, wherein receiving the property of the light beam at the wafer during scanning of the pulsed light beam across the wafer comprises receiving a location at which the light beam exposes the wafer.

6. The method of claim 1, wherein receiving the property of the light beam at the wafer during scanning of the pulsed light beam across the wafer comprises receiving an energy of the light beam as it exposes the wafer.

7. The method of claim 1, wherein modifying the performance parameter of the pulsed light beam comprises modifying a target performance parameter of the pulsed light beam, the method further comprising:

receiving a measurement of the performance parameter of the pulsed light beam;

determining whether the measured performance parameter matches the modified target performance parameter; and if it is determined that the measured performance parameter does not match the modified target performance parameter, sending a signal to the optical source to modify the performance parameter of the pulsed light beam.

8. The method of claim 1, wherein receiving the light beam property at the wafer comprises:

receiving a control signal from the lithography exposure apparatus to the optical source; and determining the light beam property at the wafer based on the received control signal.

9. The method of claim 1, wherein determining the modification to the performance parameter of the pulsed light beam comprises:

accessing a stored set of performance parameters as a function of light beam properties at the wafer;

selecting the value for the performance parameter within the accessed set that corresponds to the received property of the light beam at the current wafer; and comparing the selected value of the performance parameter with a current value of the performance parameter of the pulsed light beam.

10. The method of claim 9, further comprising, if the selected value of the performance parameter does not match the current value, then determining that the current performance parameter needs to be adjusted to match the selected value.

11. The method of claim 9, wherein determining the value of the wafer physical property comprises receiving a set of measured physical properties of the wafer at a set of light beam properties at the wafer.

12. The method of claim 11, further comprising:

for each light beam property at the wafer in the set, determining a performance parameter of the pulsed light beam based on the measured wafer physical property; and storing the determined performance parameter at each light beam property within the set.

13. The method of claim 1, wherein:

scanning the pulsed light beam across the wafer comprises scanning the pulsed light beam across a field of the wafer, the field being a fraction of the total area of the wafer exposed; and receiving the property of the light beam comprises receiving the property of the light beam during the scanning of the pulsed light beam across the field of the wafer.

14. The method of claim 1, wherein modifying the performance parameter of the pulsed light beam comprises modifying one or more of a spectral feature, an error of a spectral feature, an energy of the pulsed light beam, a dose of the pulsed light beam, an error in a wavelength of the pulsed light beam, a bandwidth of the pulsed light beam, and a spectral shape of the pulsed light beam.

15. The method of claim 1, further comprising correcting errors in patterning at the wafer based on modifying the performance parameter of the pulsed light beam.

16. The method of claim 15, wherein the errors in the wafer patterning are corrected without modifying the lithography exposure apparatus.

17. The method of claim 15, wherein the errors in the wafer patterning are corrected without modifying optical features or components within the lithography exposure apparatus.

18. The method of claim 1, wherein modifying the performance parameter of the pulsed light beam comprises modifying a spectral feature of the pulsed light beam, the method further comprising generating an estimate of a spectral feature each time the light beam property is received.

19. The method of claim 1, wherein the light beam property is received at each field of the wafer, the field being a fraction of the total area of the wafer exposed and that area of the wafer that is exposed in one scan of an exposure window.

20. The method of claim 1, wherein producing the pulsed light beam comprises perturbing a spectral shape of the pulsed light beam on a pulse-to-pulse basis.

21. The method of claim 20, wherein perturbing the spectral shape of the pulsed light beam on a pulse-to-pulse basis comprises shifting a central wavelength of each pulse of the light beam from a baseline wavelength in a predefined repeating pattern.

22. The method of claim 21, wherein modifying the performance parameter of the pulsed light beam comprises modifying how much the central wavelength of each pulse of the light beam is shifted from the baseline wavelength.

23. The method of claim 1, further comprising, before scanning the wafer:

measuring the wafer physical property within a scan at each exposure field of one or more previously exposed wafers; and creating a table that correlates each measured wafer physical property for each exposure field across an entire wafer that is exposed with the pulsed light beam.

24. The method of claim 23, wherein determining the value of the wafer physical property comprises receiving the measured wafer physical property for the current exposure field from the created table.

25. The method of claim 23, wherein receiving the light beam property comprises:
receiving a detection of a start of an exposure of the wafer; and
receiving a detection of an end of the exposure of the wafer.

26. A photolithography system comprising:
an optical source that produces a pulsed light beam;
a set of optical components that direct the pulsed light beam to a wafer of a photolithography exposure apparatus to thereby expose the wafer with the pulsed light beam;
a scanning optical system within the photolithography exposure apparatus configured to scan the pulsed light beam across the wafer;
a monitoring module within the photolithography exposure apparatus that detects a property of the pulsed light beam at the wafer as the pulsed light beam is scanned across the wafer, and outputs the property of the pulsed light beam; and
a control system connected to the monitoring module and to the optical source, the control system being configured to:
receive, from the monitoring module, the detected property of the pulsed light beam at the wafer as the pulsed light beam is scanned across the wafer;
determine a value of a physical property of a wafer that correlates with the outputted pulsed light beam property by selecting the value of the physical property of the wafer based on the received pulsed light beam property; and
determine a modification to a performance parameter of the pulsed light beam based on the pulsed light beam property that is output from the monitoring module and on the determined value of the wafer physical property; and
an optical source module connected to the performance parameter module to receive the determined modification for the performance parameter and connected to an optical source actuation system that actuates one or more physical features of the optical source to modify one or more performance parameters of the optical source based on the received determined modification for the performance parameter.

27. The photolithography system of claim 26, further comprising a metrology module that includes:
a wafer holder that receives one or more wafers; and
a detection system that measures the physical property of the wafer for each light beam property at the wafer and outputs the measured wafer physical property for each light beam property at the wafer.

28. The photolithography system of claim 27, wherein the metrology module is integrated within the photolithography exposure apparatus so that the detection system measures the physical property of the wafer in real time and during exposure of the current wafer mounted to the wafer holder.

29. The photolithography system of claim 26, wherein the light beam property at the wafer includes a location of the pulsed light beam as it exposes the wafer.

30. The photolithography system of claim 26, wherein the control system comprises:
a correlation module that receives a set of measured values of a physical property of a wafer for a set of pulsed light beam properties at the wafer and outputs a correlation recipe between a target performance parameter of the pulsed light beam and the pulsed light beam property at the wafer based on the received values; and
a performance parameter module that receives the pulsed light beam property from the monitoring module and receives the correlation recipe from the correlation module, and is configured to determine the modification to the performance parameter based on the pulsed light beam property output from the monitoring module and the correlation recipe.

* * * * *